(12) United States Patent
Yu et al.

(10) Patent No.: US 12,300,575 B2
(45) Date of Patent: May 13, 2025

(54) SEMICONDUCTOR PACKAGE AND METHOD

(71) Applicant: Taiwan Semiconductor Manufacturing Co., Ltd., Hsinchu (TW)

(72) Inventors: Chen-Hua Yu, Hsinchu (TW); Chuei-Tang Wang, Taichung (TW); Shih-Chang Ku, Taipei (TW); Chien-Yuan Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 381 days.

(21) Appl. No.: 17/661,622

(22) Filed: May 2, 2022

(65) Prior Publication Data

US 2023/0352367 A1 Nov. 2, 2023

(51) Int. Cl.
*H01L 23/433* (2006.01)
*H01L 23/00* (2006.01)
(Continued)

(52) U.S. Cl.
CPC .......... *H01L 23/4334* (2013.01); *H01L 24/08* (2013.01); *H01L 24/80* (2013.01);
(Continued)

(58) Field of Classification Search
CPC ..... H01L 23/4334; H01L 24/08; H01L 24/80; H01L 25/0657; H01L 24/16; H01L 24/32; H01L 24/73; H01L 24/94; H01L 24/97; H01L 25/105; H01L 2224/08148; H01L 2224/08221; H01L 2224/16227; H01L 2224/16235; H01L 2224/16237; H01L 2224/32225; H01L 2224/73204; H01L 2224/80895; H01L 2224/80896; H01L 2225/06524; H01L 2225/06541; H01L 2225/06589; H01L 2225/1023;
(Continued)

(56) References Cited

U.S. PATENT DOCUMENTS

| 8,993,380 B2 | 3/2015 | Hou et al. |
| 9,000,584 B2 | 4/2015 | Lin et al. |

(Continued)

FOREIGN PATENT DOCUMENTS

| TW | 202129887 A | 8/2021 |
| TW | 202141708 A | 11/2021 |

*Primary Examiner* — Joe E. Schoenholtz
(74) *Attorney, Agent, or Firm* — Slater Matsil, LLP

(57) ABSTRACT

A device includes a first semiconductor device including a first bonding layer; a second semiconductor device bonded to the first bonding layer of the first semiconductor device; thermal structures disposed beside the second semiconductor device and on the first bonding layer, wherein the thermal structures include a conductive material, wherein the thermal structures are electrically isolated from the first semiconductor device and from the second semiconductor device; an encapsulant disposed on the first bonding layer, wherein the encapsulant surrounds the second semiconductor device and surrounds the thermal structures; and a second bonding layer disposed over the encapsulant, the thermal structures, and the second semiconductor device.

20 Claims, 22 Drawing Sheets

(51) Int. Cl.
  *H01L 25/065* (2023.01)
  *H01L 25/10* (2006.01)
(52) U.S. Cl.
  CPC .......... *H01L 25/0657* (2013.01); *H01L 24/16* (2013.01); *H01L 24/32* (2013.01); *H01L 24/73* (2013.01); *H01L 24/94* (2013.01); *H01L 24/97* (2013.01); *H01L 25/105* (2013.01); *H01L 2224/08148* (2013.01); *H01L 2224/08221* (2013.01); *H01L 2224/16227* (2013.01); *H01L 2224/16235* (2013.01); *H01L 2224/16237* (2013.01); *H01L 2224/32225* (2013.01); *H01L 2224/73204* (2013.01); *H01L 2224/80895* (2013.01); *H01L 2224/80896* (2013.01); *H01L 2225/06524* (2013.01); *H01L 2225/06541* (2013.01); *H01L 2225/06589* (2013.01); *H01L 2225/1023* (2013.01); *H01L 2225/1058* (2013.01); *H01L 2225/1094* (2013.01); *H01L 2924/1431* (2013.01); *H01L 2924/1436* (2013.01); *H01L 2924/182* (2013.01); *H01L 2924/3511* (2013.01); *H01L 2924/3512* (2013.01); *H01L 2924/37001* (2013.01)

(58) Field of Classification Search
  CPC ..... H01L 2225/1058; H01L 2225/1094; H01L 2924/1431; H01L 2924/1436; H01L 2924/182; H01L 2924/3511; H01L 2924/3512; H01L 2924/37001; H01L 21/76898; H01L 23/147; H01L 23/49827; H01L 2221/68345; H01L 2225/1041; H01L 21/6835; H01L 23/49838; H01L 23/562; H01L 21/486; H01L 21/561; H01L 23/3128; H01L 23/3135; H01L 23/36; H01L 23/49816; H01L 23/3677; H01L 23/5389; H01L 25/50
  See application file for complete search history.

(56) References Cited

U.S. PATENT DOCUMENTS

| | | | |
|---|---|---|---|
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,299,649 | B2 | 3/2016 | Chiu et al. |
| 9,368,460 | B2 | 6/2016 | Yu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 11,443,995 | B2 * | 9/2022 | Yu .............. H01L 25/18 |
| 2019/0096791 | A1 * | 3/2019 | Jeng ............ H01L 21/56 |
| 2020/0105635 | A1 * | 4/2020 | Yu .............. H01L 23/3677 |
| 2021/0098323 | A1 * | 4/2021 | Yu .............. H01L 23/5226 |
| 2021/0225790 | A1 | 7/2021 | Chen et al. |
| 2021/0327866 | A1 | 10/2021 | Yu et al. |

* cited by examiner

SEMICONDUCTOR PACKAGE AND METHOD

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
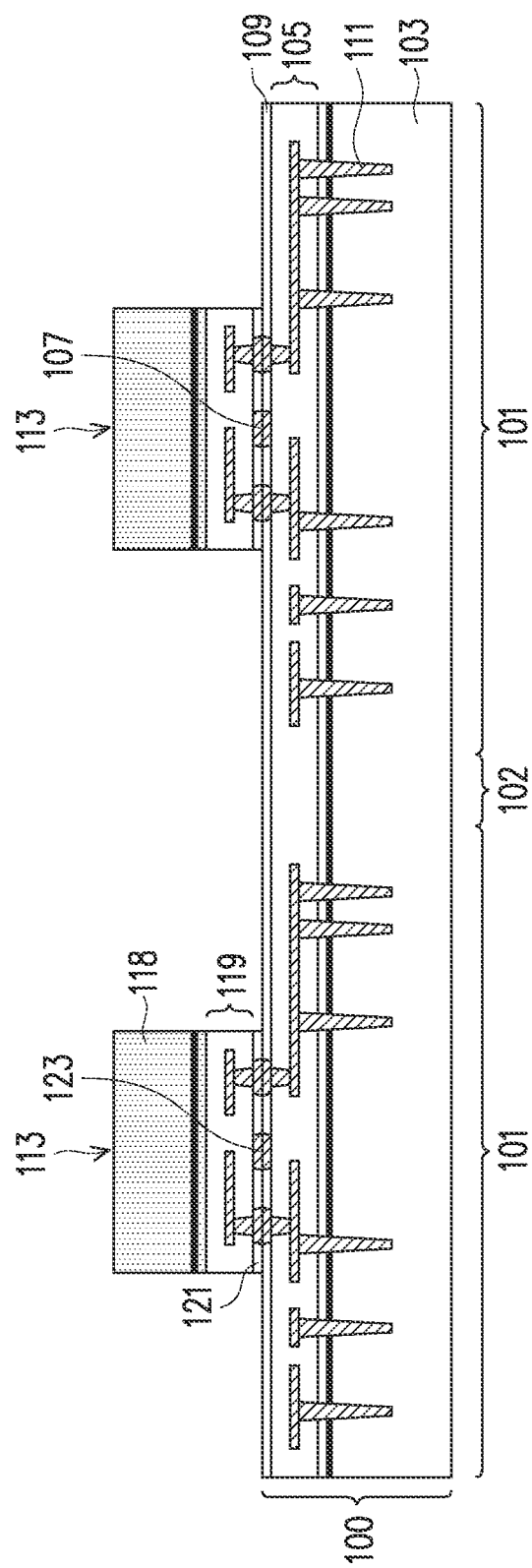
FIG. 1A illustrates a cross-sectional view of an intermediate step during a process for forming a device package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, packages comprising stacked semiconductor devices are described. The packages include thermal structures comprising a high thermal conductivity material formed within a gap-filling material having a lower thermal conductivity. In this manner, the formation of thermal structures as described herein can improve heat dissipation within a package and thus reduce thermal effects, improve device operation, or improve device reliability.

Figure 1B:
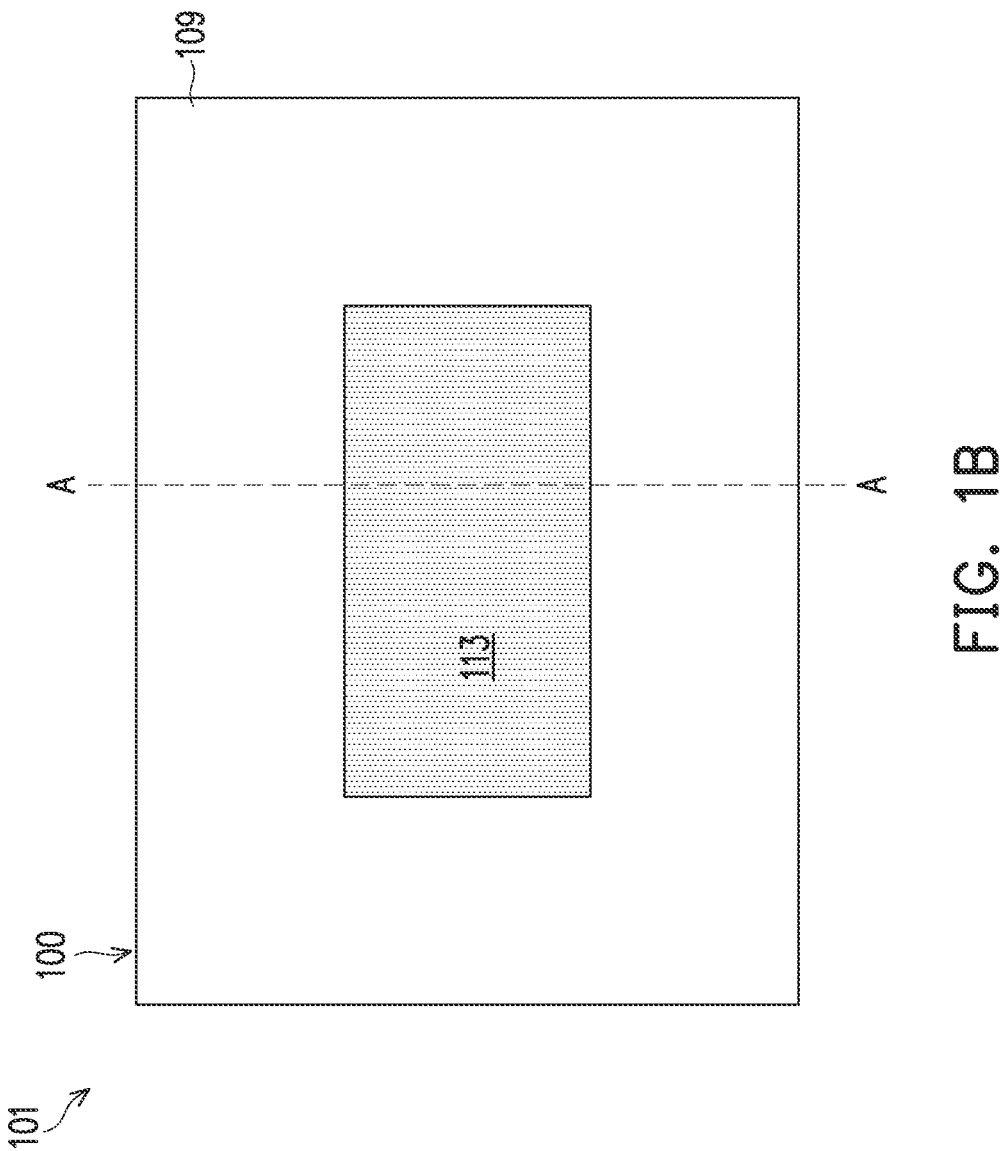
FIG. 1B illustrates a plan view of an intermediate step during a process for forming a device package, in accordance with some embodiments.

FIG. 1A illustrates a cross-sectional view of multiple first semiconductor devices 101 formed in a wafer 100, in accordance with some embodiments. A second semiconductor device 113 has been bonded to each first semiconductor device 101, described in greater detail below. FIG. 1B illustrates a plan view of a first semiconductor device 101 and a corresponding second semiconductor device 113 bonded thereto, in accordance with some embodiments. A representative cross-section corresponding to the cross-sectional view of FIG. 1A is shown in FIG. 1B as cross-section A-A.

In a particular embodiment, the first semiconductor devices 101 may be a memory device, such as a wide I/O dynamic random access memory (DRAM) device which has a large number of I/O interfaces (e.g., greater than 256 interfaces), so that a large bandwidth of data may be realized even at low clock speeds. However, the first semiconductor devices 101 may also be any other suitable type of memory device with a high rate of data transfer, such as an LPDDRn memory device or the like. The first semiconductor devices 101 may be any other suitable device, such as a logic die (e.g., central processing unit (CPU), graphics processing unit (GPU), application processor (AP), microcontroller, etc.), a power management die (e.g., power management integrated circuit (PMIC) die), a radio frequency (RF) die, a sensor die, a signal processing die (e.g., digital signal processing (DSP) die), a front-end die (e.g., analog front-end (AFE) dies), the like, or combinations thereof.

The first semiconductor devices 101 may be formed in a wafer 100, which may be processed according to applicable manufacturing processes. In an embodiment, the first semiconductor devices 101 comprise a first substrate 103, first active devices (not separately illustrated), first metallization layers 105, a first wafer bond layer 109, and first conductive wafer bond material 107. In some embodiments, the first substrate 103 includes a semiconductor substrate, such as silicon, doped or undoped, or an active layer of a semiconductor-on-insulator (SOI) substrate. The first substrate 103 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, the first substrate 103 has an active surface (e.g., the surface facing upwards in FIG. 1), sometimes called a front side, and an inactive surface (e.g., the surface facing downwards in FIG. 1), sometimes called a back side.

The first active devices may be formed at the front surface of the first substrate 103. The first active devices comprise a wide variety of active devices (e.g., transistors, diodes, or the like) and passive devices (e.g., capacitors, resistors, inductors, or the like) that may be used to generate the desired structural and functional requirements of the design for the first semiconductor devices 101. The first active devices may be formed using any suitable methods.

The first metallization layers 105 are formed over the first substrate 103 and the first active devices and are designed to connect the various first active devices to form functional circuitry. In some embodiments, the first metallization layers 105 are formed of alternating layers of dielectric materials (e.g., low-k dielectric materials or the like) and conductive materials. The first metallization layers 105 may be formed using any suitable process (such as deposition, damascene, dual damascene, etc.). In an embodiment, there may be four layers of metallization separated from the first substrate 103 by at least one interlayer dielectric layer (ILD), though other numbers of layers are possible, and the precise number of first metallization layers 105 may be dependent upon the design of the first semiconductor devices 101.

In some embodiments, the first wafer bond layer 109 may be formed on the first substrate 103 over the first metallization layers 105. The first wafer bond layer 109 may be used for bonding the first semiconductor devices 101 to other structures (e.g., the second semiconductor devices 113, described below). For example, the first wafer bond layer 109 may be used for a bonding process such as direct bonding, fusion bonding, dielectric-to-dielectric bonding, oxide-to-oxide bonding, or the like. In accordance with some embodiments, the first wafer bond layer 109 is formed of a silicon-containing dielectric material such as silicon oxide, silicon nitride, or the like. The first wafer bond layer 109 may be deposited using any suitable method, such as, atomic layer deposition (ALD), chemical vapor deposition (CVD), physical vapor deposition (PVD), or the like. The first wafer bond layer 109 may be deposited to a thickness of between about 1 nm and about 1000 nm, for example. However, any suitable material, process, or thickness may be utilized.

The first conductive wafer bond material 107 may be used for bonding the first semiconductor devices 101 to other structures (e.g., the second semiconductor devices 113, described below). For example, the first conductive wafer bond material 107 may be used for a bonding process such as direct bonding, fusion bonding, metal-to-metal bonding, or the like. In some embodiments, both the first conductive wafer bond material 107 and the first wafer bond layer 109 are used for bonding the first semiconductor devices 101 to other structures.

The first conductive wafer bond material 107 may be formed using any suitable technique, such as damascene, dual damascene, or the like. As an example, the first conductive wafer bond material 107 may be formed by first forming bond openings (not separately illustrated) within the first wafer bond layer 109. In an embodiment, the bond openings may be formed by first applying and patterning a photoresist over the top surface of the first wafer bond layer 109. The first wafer bond layer 109 is then etched using the patterned photoresist as an etching mask in order to form the openings. The first wafer bond layer 109 may be etched by dry etching (e.g., reactive ion etching (RIE) or neutral beam etching (NBE)), wet etching, or the like. In accordance with some embodiments of the present disclosure, the etching stops on the first metallization layers 105 such that the first metallization layers 105 are exposed through the openings in the first wafer bond layer 109. Other techniques of forming the bond openings are possible.

Once the first metallization layers 105 have been exposed by the bond openings, the first conductive wafer bond material 107 may be formed, in accordance with some embodiments. The first conductive wafer bond material 107 may be formed to make physical and electrical contact with the first metallization layers 105. In an embodiment, the first conductive wafer bond material 107 may comprise a barrier layer, a seed layer, a fill metal, or a combination thereof. For example, the barrier layer may first be blanket deposited over the first metallization layers 105. The barrier layer may comprise titanium, titanium nitride, tantalum, tantalum nitride, the like, or a combination thereof. The seed layer may be a conductive material such as copper and may be blanket deposited over the barrier layer using a suitable process, such as sputtering, evaporation, plasma-enhanced chemical vapor deposition (PECVD), or the like. The fill metal may be a conductive material such as copper or a copper alloy and may be deposited using a suitable process, such as electroplating, electroless plating, or the like. The fill metal may fill or overfill the bond openings, in some embodiments. Once the fill metal has been deposited, excess material of the fill metal, the seed layer, and the barrier layer may be removed using, for example, a planarization process such as chemical mechanical polishing (CMP). After the planarization process, top surfaces of the first conductive wafer bond material 107 and the first wafer bond layer 109 may be substantially level or coplanar, in some cases.

However, the above described embodiment in which the first wafer bond layer 109 is formed, patterned, and the first conductive wafer bond material 107 is plated into openings before being planarized is intended to be illustrative and is not intended to be limiting upon the embodiments. Rather, any suitable method of formation of the first wafer bond layer 109 and the first conductive wafer bond material 107 may be utilized. In other embodiments, the first conductive wafer bond material 107 may be formed first using, for example, a photolithographic patterning and plating process. The dielectric material of the first wafer bond layer 109 may then be deposited to gap fill the area around the first conductive wafer bond material 107. A planarization process may then be performed to remove excess material. Any suitable manufacturing processes are fully intended to be included within the scope of the embodiments.

Additionally, at any desired point in the manufacturing process, through substrate vias (TSVs) 111 may be formed within the first substrate 103 and, if desired, within one or more layers of the first metallization layers 105. The TSVs 111 may be formed in order to provide electrical connectivity from a front side of the first substrate 103 to a back side of the first substrate 103. In an embodiment the TSVs 111 may be formed by initially forming TSV openings (not separately illustrated) into the first substrate 103 and, if desired, any of the overlying first metallization layers 105.

For example, in some embodiments, the TSV openings may be formed after a first metallization layer 105 has been formed but prior to formation of the next overlying first metallization layer 105. The TSV openings may be formed, for example, by applying and patterning a suitable photoresist, and then etching portions of the exposed materials to a desired depth. The TSV openings may be formed to extend into the first substrate 103 to a depth greater than the eventual desired height of the first substrate 103, in some embodiments. In some embodiments, the depth may be between about 20 μm and about 200 μm, though it should be noted that the depth is dependent upon the overall design and other depths are possible.

In some embodiments, once the TSV openings have been formed within the first substrate 103 and any first metallization layers 105, the TSV openings may be lined with a liner. The liner may be, for example, an oxide formed from tetraethylorthosilicate (TEOS), silicon nitride, or any other suitable dielectric material. The liner may be formed, for example, using a thermal process, PVD, CVD, PECVD, or the like. The liner may be formed to a thickness of between about 0.1 μm and about 5 μm, though other thicknesses are possible.

In some embodiments, once the liner has been formed along the sidewalls and bottom of the TSV openings, a barrier layer may be formed and the remainder of the TSV openings may be filled with first conductive material. The first conductive material may comprise a metal such as copper, although other suitable materials may be utilized such as aluminum, doped polysilicon, combinations or alloys thereof, or the like. The first conductive material may be formed within the TSV openings, for example, by electroplating copper onto a seed layer. Once the TSV openings have been filled, excess liner, barrier layer, seed layer, and/or first conductive material outside of the TSV openings may be removed through a planarization process such as CMP, although any suitable removal process may be used.

In some embodiments, a scribe region 102 may be formed between adjacent first semiconductor devices 101. In an embodiment, the scribe region 102 may be a region through which a singulation may be performed to separate a first one of the first semiconductor devices 101 from a second one of the first semiconductor devices 101. A singulation process is described below for FIGS. 9A-9B. In some embodiments, testing structures (not separately illustrated) may be formed within the scribe region 102.

FIG. 1A additionally illustrates a bonding of second semiconductor devices 113 to the first conductive wafer bond material 107 and the first wafer bond layer 109, in accordance with some embodiments. In an embodiment, each of the second semiconductor devices 113 may each be a system-on-chip device, such as a logic device, which is configured to work in conjunction with the first semiconductor devices 101. However, devices of any suitable functionality, such as logic dies, central processing unit (CPU) dies, input/output dies, other types of dies, combinations of these, or the like, may be utilized. FIGS. 1A-1B illustrates a single semiconductor device (e.g., second semiconductor device 113) bonded to each first semiconductor device 101, but in other embodiments two or more semiconductor devices may be bonded to each first semiconductor device 101. A non-limiting example in which multiple semiconductor devices are bonded to a single first semiconductor device 101 is described below for FIG. 19.

In some embodiments, the second semiconductor devices 113 have second substrates 118, second active devices, second metallization layers 119, second wafer bond layers 121, and second conductive wafer bond material 123. In some embodiments, the second substrates 118, second active devices, second metallization layers 119, second wafer bond layers 121, and second conductive wafer bond material 123 may be formed similar to the first substrate 103, the first active devices, the first metallization layers 105, the first wafer bond layer 109, and the first conductive wafer bond material 107, described above. However, in other embodiments these structures may be formed using different processes or different materials. As shown in FIGS. 1A-1B, the second semiconductor devices 113 may have a width that is less than a width of the first semiconductor devices 101. The sizes of the first semiconductor devices 101 and the second semiconductor devices 113 shown in FIGS. 1A-1B are an example, and the first semiconductor devices 101 and the second semiconductor devices 113 may have different absolute or relative dimensions than shown.

In some embodiments, the second semiconductor devices 113 are bonded to the first semiconductor devices 101 using, for example, dielectric-to-dielectric bonding, metal-to-metal bonding, or a combination thereof (e.g., "hybrid bonding"). In some embodiments, the bonding surfaces of the first semiconductor devices 101 (e.g., the first wafer bond layer 109 and/or the first conductive wafer bond material 107) and/or the bonding surfaces of the second semiconductor devices 113 (e.g., the second wafer bond layers 121 and/or the second conductive wafer bond material 123) may be activated prior to bonding. Activating the bonding surfaces of the first semiconductor devices 101 and the second semiconductor devices 113 may comprise a dry treatment, a wet treatment, a plasma treatment, exposure to an inert gas plasma, exposure to $H_2$, exposure to $N_2$, exposure to $O_2$, the like, or combinations thereof. For embodiments in which a wet treatment is used, an RCA cleaning may be used, in some embodiments. In other embodiments, the activation process may comprise other types of treatments. The activation process facilitates bonding of the first semiconductor devices 101 and the second semiconductor devices 113.

After the activation process, the second semiconductor devices 113 may be placed into contact with the first semiconductor devices 101. In some embodiments, the second conductive wafer bond material 123 of the second semiconductor devices 113 is placed into physical contact with the first conductive wafer bond material 107 of the first semiconductor devices 101 while the second wafer bond layers 121 of the second semiconductor devices 113 is placed into physical contact with the first wafer bond layer 109 of the first semiconductor devices 101. In some cases, the bonding process between bonding surfaces begins as the bonding surfaces physically contact each other.

In some embodiments, a thermal treatment is performed after the bonding surfaces are in physical contact. The thermal treatment may strengthen the bonding between the second semiconductor devices 113 and the first semiconductor devices 101, in some cases. The thermal treatment may include a process temperature in the range of about 200° C. to about 400° C., though other temperatures are possible. In some embodiments, the thermal treatment includes a process temperature that is at or above a eutectic point for a material of the first conductive wafer bond material 107 and the second conductive wafer bond material 123. In this manner, the first semiconductor devices 101 and the second semiconductor devices 113 are bonded using dielectric-to-dielectric bonding and/or metal-to-metal bonding.

Additionally, while specific processes have been described to initiate and strengthen the bonds between the first semiconductor devices 101 and the second semiconductor devices 113, these descriptions are intended to be illustrative and are not intended to be limiting upon the embodiments. Rather, any suitable combination of baking, annealing, pressing, or other bonding processes or combination of processes may be utilized. All such processes are fully intended to be included within the scope of the embodiments.

Figure 2A:
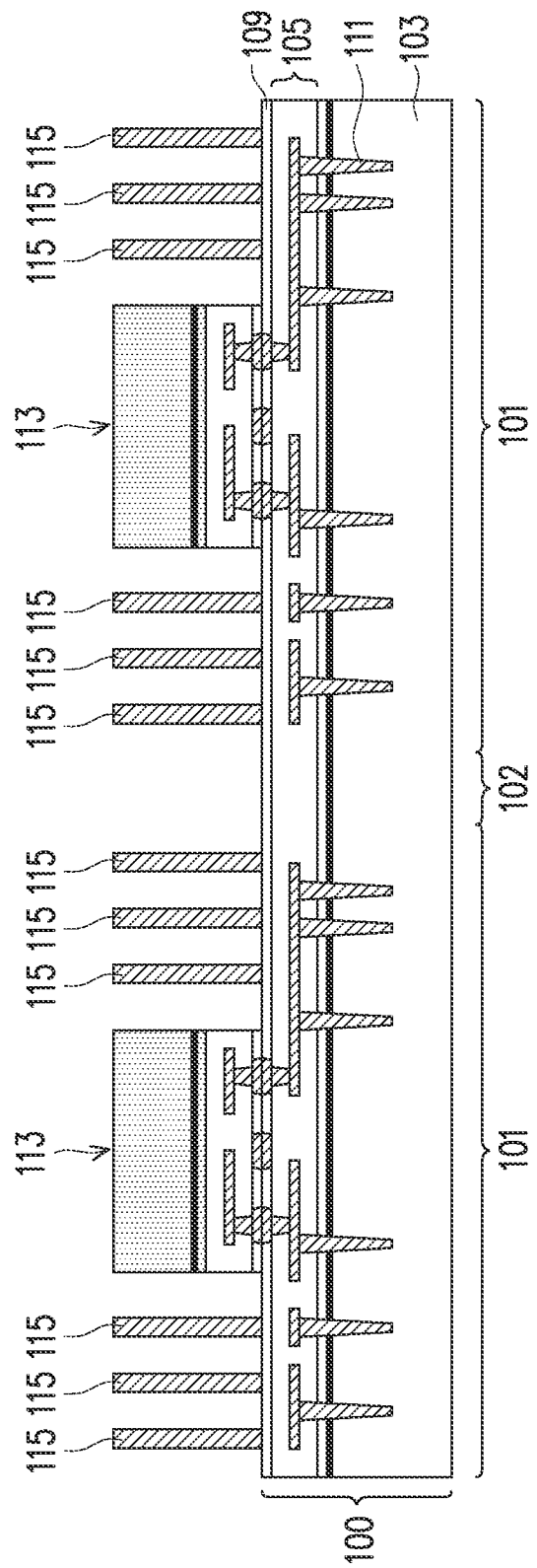
FIGS. 2A, 2B, 3, 4, 5, 6, 7, 8, 9A, and 9B illustrate cross-sectional views or plan views of intermediate steps during a process for forming a device package, in accordance with some embodiments.
Figure 2B:
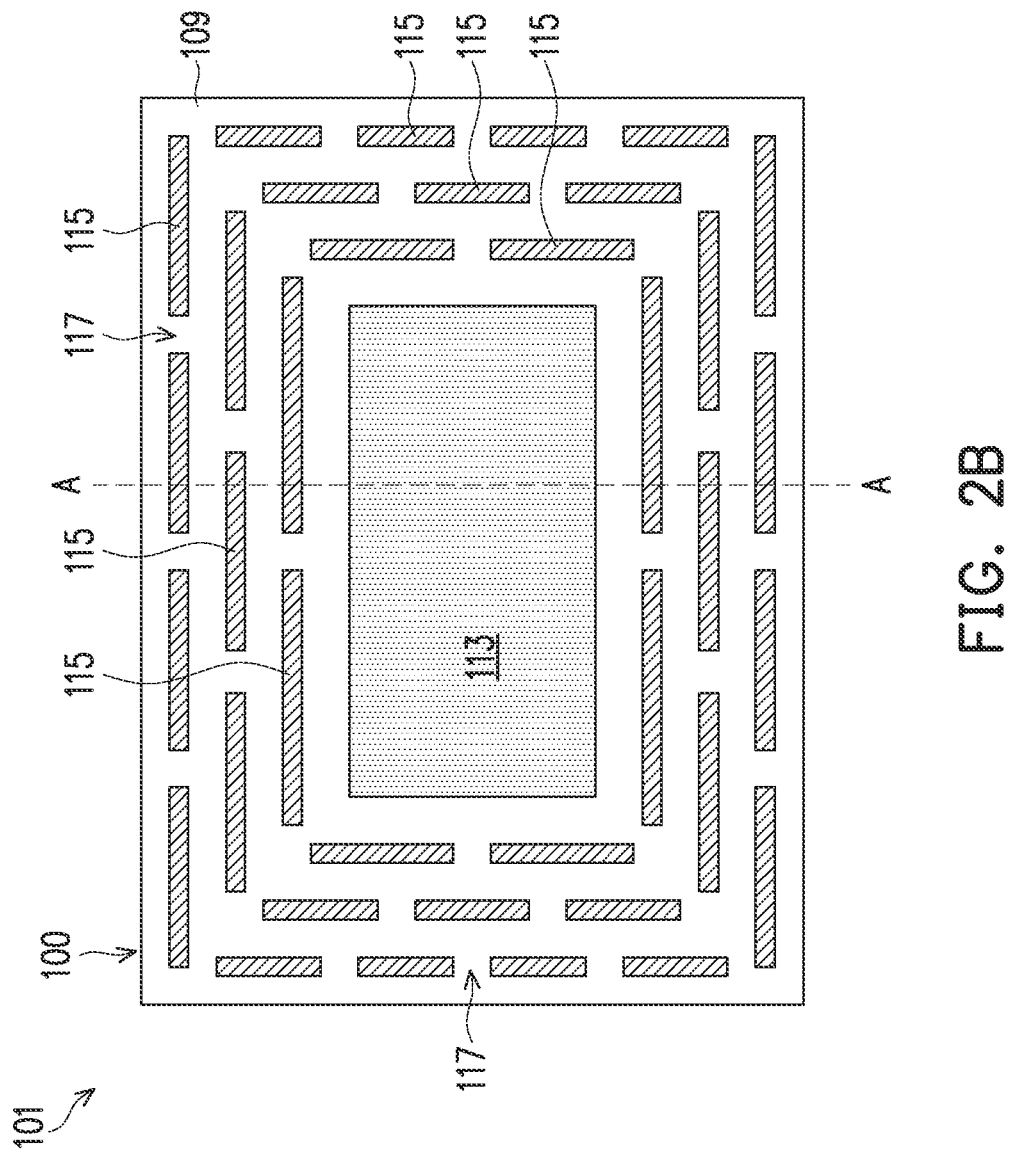

FIGS. 2A and 2B illustrate the formation of thermal structures 115 on the first semiconductor devices 101, in accordance with some embodiments. As shown in FIGS. 2A-2B, multiple thermal structures 115 may be formed on regions of the first semiconductor devices 101 that are not bonded to the second semiconductor devices 113. The thermal structures 115 may provide improved heat dissipation for the first semiconductor devices 101 and/or the second semiconductor devices 113, in some cases. The thermal structures 115 may be formed of one or more materials having a relatively high thermal conductivity, such as a thermal conductivity greater than about 120 W/m-K. For example, the thermal structures 115 may be formed from a material that has a thermal conductivity that is greater than the thermal conductivity of a surrounding encapsulant (e.g., encapsulant 130 described below for FIG. 4). In some embodiments, the thermal structures 115 may have a thermal conductivity that is in the range of about 200 W/m-K to about 400 W/m-K, though other values are possible. In some embodiments, the thermal structures 115 comprise a metal such as copper, a copper alloy, aluminum, silver, gold, the like, or a combination thereof. In other embodiments, the thermal structures 115 comprise a dielectric material, such as low-K material, molding compound, the like, or a combination thereof. Other materials are possible.

In some embodiments, the thermal structures 115 may be formed using one or more deposition processes, such as ALD, PVD, CVD, spin-on, plating, or the like. For example, in some embodiments, the thermal structures 115 may be formed by depositing the material of the thermal structures 115 (referred to herein as the "thermal material") over exposed regions of the first wafer bond layer 109 and then patterning the thermal material to form the thermal structures 115. For example, a photoresist structure may be formed over the thermal material and patterned using suitable photolithographic techniques. The thermal material may be etched using the patterned photoresist structure as an etch mask, with the remaining portions of the thermal material forming the thermal structures 115. The etching of the thermal material may comprise a wet etching process and/or a dry etching process.

In other embodiments, the thermal structures 115 may be formed by depositing a mask material over exposed regions of the first wafer bond layer 109 and then patterning trenches in the mask material corresponding to the thermal structures 115. The mask material may comprise, for example, a dielectric material, an oxide, a photoresist, an encapsulant (e.g. the encapsulant 130 of FIG. 4), the like, or a combination thereof. The trenches may be patterned in the mask material using a suitable photolithography and etching process. The thermal material may then be deposited in the trenches, and may fill or overfill the trenches. Excess portions of the thermal material may then be removed using, for example, a planarization process or an etching process, with the remaining portions of the thermal material forming the thermal structures 115. In some embodiments, the mask material may be removed after depositing the thermal material, but in other embodiments the mask material may be left remaining on the first wafer bond layer 109 after depositing the thermal material.

In some embodiments, thermal structures 115 comprising metal may be formed using a seed layer and a plating process. As an example, a seed layer (not separately illustrated) may be formed over the exposed regions of the first wafer bond layer 109. In some embodiments, the seed layer is a metal layer, which may be a single layer or a composite layer comprising multiple sub-layers formed of different materials. In a particular embodiment, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the thermal structures 115. The patterning forms openings through the photoresist to expose the seed layer. A metal material is formed in the openings of the photoresist and on the exposed portions of the seed layer. The metal material may be formed by plating, such as by electroplating, electroless plating, or the like. The photoresist and portions of the seed layer on which the metal material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by a wet etching process or a dry etching process. The remaining portions of the seed layer and conductive material form the thermal structures 115. The thermal structures 115 are formed over the first wafer bond layer 109 and are thus electrically isolated from the first metallization layers 105 by the first wafer bond layer 109, in some embodiments.

Figure 3:
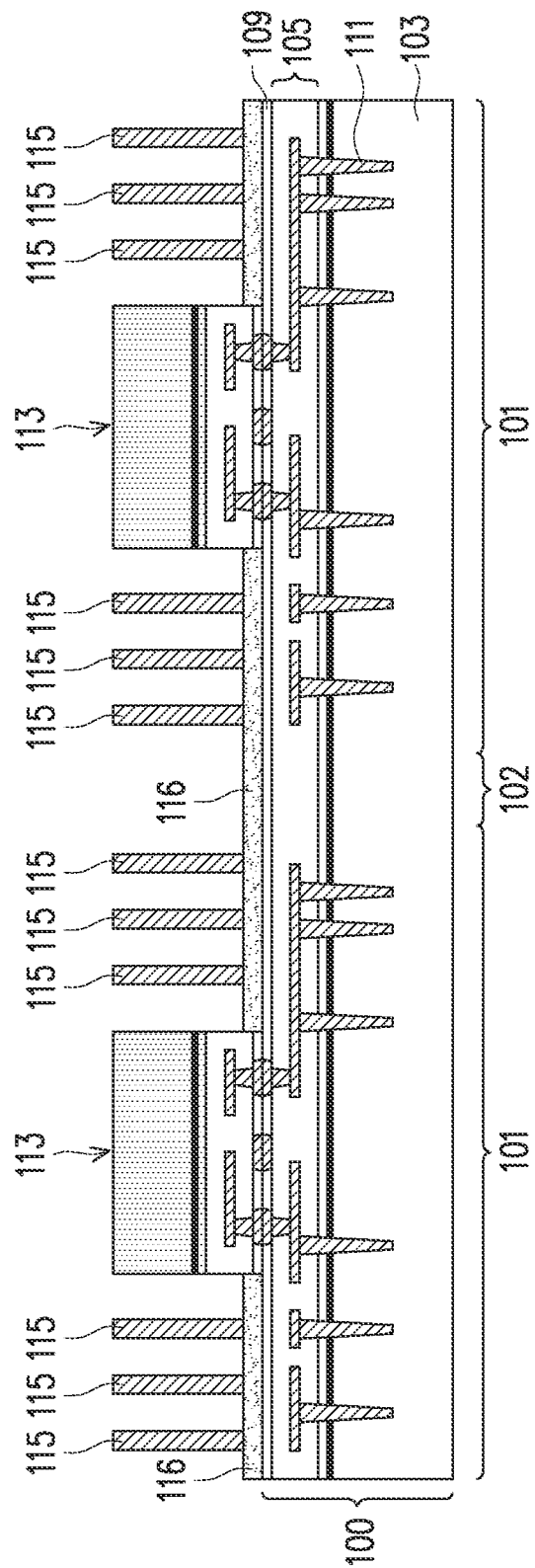

In other embodiments, the thermal structures 115 may be manufactured separately and then attached to the first wafer bond layer 109 using an adhesive. In some embodiments, the thermal structures 115 may be formed on a carrier substrate which is removed after the thermal structures 115 are attached to the first wafer bond layer 109. As an example, FIG. 3 illustrates thermal structures 115 attached to the first wafer bond layer 109 by a layer of adhesive 116. In some embodiments, the layer of adhesive 116 is first be formed on the first wafer bond layer 109 and then the thermal structures 115 are placed on the layer of adhesive 116. In other embodiments, an adhesive is first applied to surfaces of the thermal structures 115 and then the thermal structures 115 are placed on the first wafer bond layer 109 such that the thermal structures 115 are attached to the first wafer bond layer 109 by the adhesive. In other embodiments, an adhesive may be applied to both the thermal structures 115 and the first wafer bond layer 109. The adhesive may be any suitable adhesive, epoxy, die attach film (DAF), or the like. Other techniques for forming thermal structures 115 separately or attaching thermal structures 115 using an adhesive are possible.

The thermal structures 115 may be formed having a height above the first wafer bond layer 109 that is less than, about the same as, or greater than a height of the second semiconductor devices 113. For example, a thermal structure 115 may have a height that is in the range of about 1 μm to about 200 μm. As shown in FIG. 2B, the thermal structures 115 may be substantially rectangular in a plan view (e.g., have a rectangular "footprint"), in which a length of a thermal structure 115 is about the same as or greater than a width of a thermal structure 115. In some embodiments, a thermal structure 115 has a length in the range of about 50 μm to about 2000 μm and a width in the range of about 50 μm to about 200 μm. In some embodiments, a thermal structure 115 has a length:width ratio that is between about 1:1 and about 10:1. In this manner, a thermal structure 115 may be considered to have a "wall" shape, in some cases. Other heights, lengths, or widths are possible.

In other embodiments the thermal structures 115 may have a shape or footprint other than rectangular. For example, thermal structures 115 may have a rounded shape (e.g., a circle, an oval, a stadium, or the like), a regular or irregular polygonal shape, an "L" shape, a "T" shape, an "X" shape, an "H" shape, an enclosed shape (e.g., an annulus, a ring, or the like), the like, or any other suitable shape. These and other such variations are considered within the scope of the present disclosure. Several non-limiting examples of thermal structures 115 of different shapes and in different arrangements are described below for FIGS. 17-19.

As shown in FIGS. 2A and 2B, the thermal structures 115 may comprise a plurality of structures in an arrangement that at least partially surrounds the second semiconductor device 113. For example, FIG. 2B shows thermal structures 115 adjacent all four sides of the second semiconductor device 113. The arrangement shown in FIGS. 2A-2B is a representative example, and other arrangements of thermal structures 115 are possible. In other embodiments, the thermal structures 115 may be adjacent to one side, two sides (e.g., neighboring or opposite sides), or three sides of a second semiconductor device 113. In some embodiments, a thermal structure 115 may be separated from a second semiconductor device 113 by a distance in the range of about 100 μm to about 500 μm, though other separation distances are possible.

In some embodiments, the thermal structures 115 may be arranged in rows. For example, FIG. 2B shows an arrangement in which three parallel rows of thermal structures 115 are adjacent each side of the second semiconductor device 113. In other embodiments, any suitable number of rows of thermal structures 115 (e.g., one, two, four, or more) may be formed adjacent a side of a second semiconductor device 113, and different sides may have different numbers of adjacent rows. In this manner, any suitable number of rows of thermal structures 115 may be formed between an edge of the second semiconductor device 113 and a corresponding edge of the first semiconductor device 101. Adjacent rows of thermal structures 115 may be separated by a distance in the range of about 100 μm to about 500 μm, though other separation distances are possible. For embodiments comprising three or more adjacent rows, the rows may be separated by the same distance or by different distances.

Still referring to FIG. 2B, a row of thermal structures 115 may comprise one or more adjacent thermal structures 115 arranged in a line. In the embodiment shown, adjacent thermal structures 115 in the same row are separated by gaps 117. In some cases, forming gaps 117 between thermal structures 115 can reduce or absorb stress within a device package 200 (see FIGS. 9A-9B), which can improve package reliability and reduce effects due to stress or heating. The gaps 117 between adjacent thermal structures 115 of a row may be the same distance or may be different distances. In some embodiments, the gaps 117 may be a distance in the range of about 100 μm to about 500 μm, though other distances are possible.

Figure 4:
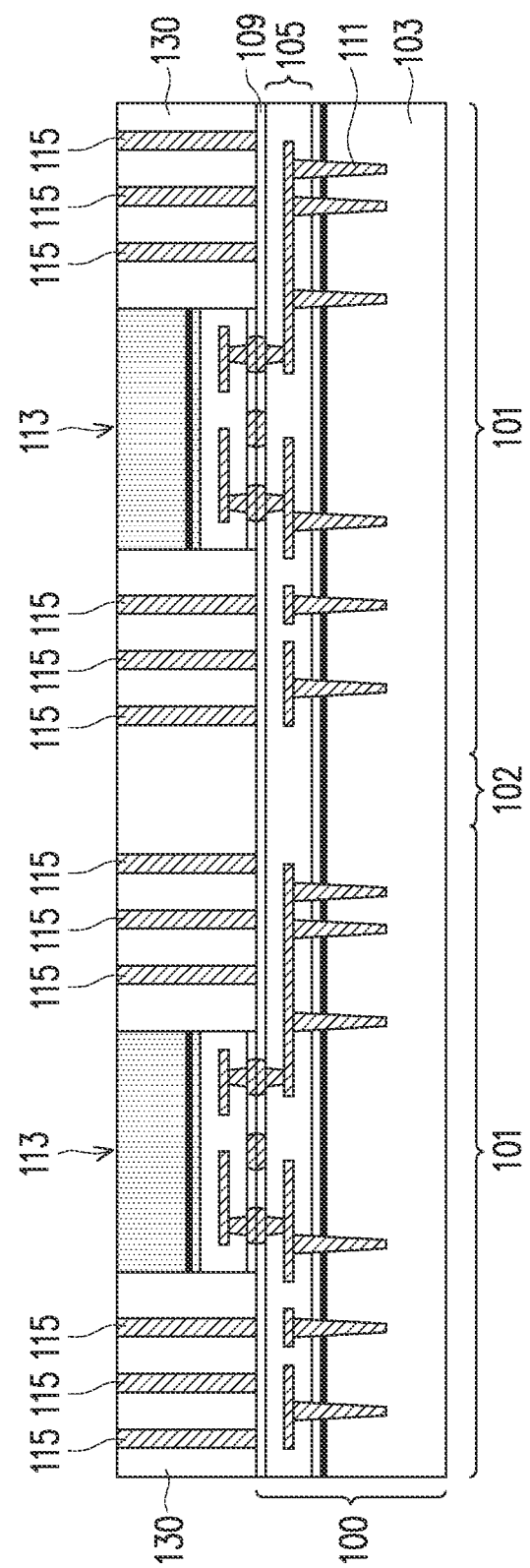

In FIG. 4, the first semiconductor devices 101, the second semiconductor devices 113, and the thermal structures 115 are encapsulated with an encapsulant 130, in accordance with some embodiments. In an embodiment, the encapsulation may be performed in a molding device, which may comprise a top molding portion and a bottom molding portion separable from the top molding portion. The top molding portion may be configured to be lowered onto the bottom molding portion, forming a molding cavity that encloses the first semiconductor devices 101, the second semiconductor devices 113, and the thermal structures 115.

The encapsulation process may comprise compression molding, transfer molding, injection molding, or the like. For example, the encapsulant 130 may be placed within the molding cavity prior to the lowering of the top molding portion onto the bottom molding portion, or else may be injected into the molding cavity through an injection port. The encapsulant 130 may be an epoxy or a molding compound resin such as polyimide, polyphenylene sulfide (PPS), polyetheretherketone (PEEK), poly ether sulphone (PES), a heat resistant crystal resin, combinations of these, or the like. In other embodiments, the encapsulant 130 is a dielectric material such as an oxide, a nitride, a spin-on glass, or the like. In some embodiments, the thermal conductivity of the thermal structures 115 is greater than the thermal conductivity of the encapsulant 130. In this manner, the formation of the thermal structures 115 within the encapsulant 130 can improve heat dissipation. In some embodiments, the encapsulant 130 is applied in a liquid or semi-liquid form. The encapsulant 130 may be applied such that the first semiconductor devices 101, the second semiconductor devices 113 and the thermal structures 115 are buried or covered. The encapsulant 130 is further formed in gap regions around the second semiconductor devices 113 and between the thermal structures 115. In some embodiments, the encapsulant 130 may then be cured.

Further in FIG. 4, a planarization process is performed on the encapsulant 130 to expose the second semiconductor devices 113 and the thermal structures 115, in accordance with some embodiments. The planarization process may also remove material of the second semiconductor devices 113 and/or the thermal structures 115 until the second semiconductor devices 113 and/or the thermal structures 115 are exposed. In some embodiments, top surfaces of the second semiconductor devices 113, the thermal structures 115, and the encapsulant 130 are substantially level or coplanar after the planarization process (within process variations). The planarization process may include, for example, a CMP process, a grinding process, an etching process, or the like. In some embodiments, the planarization process may be omitted, for example, if the second semiconductor devices 113 and/or the thermal structures 115 are already exposed after encapsulation. In some embodiments in which top surfaces of the second semiconductor devices 113 are higher than top surfaces of the thermal structures 115, the thermal structures 115 may remain covered by the encapsulant 130 after the planarization process.

Figure 5:
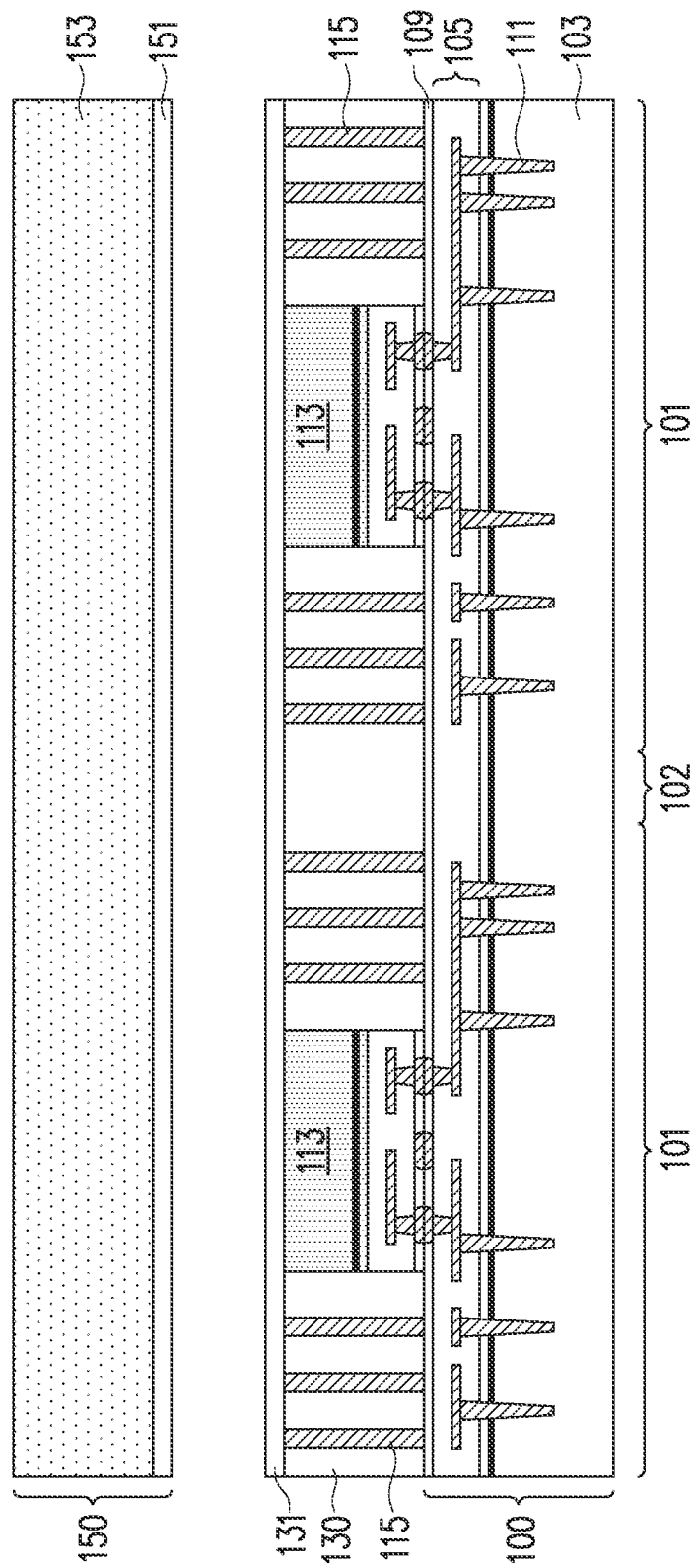
Figure 6:
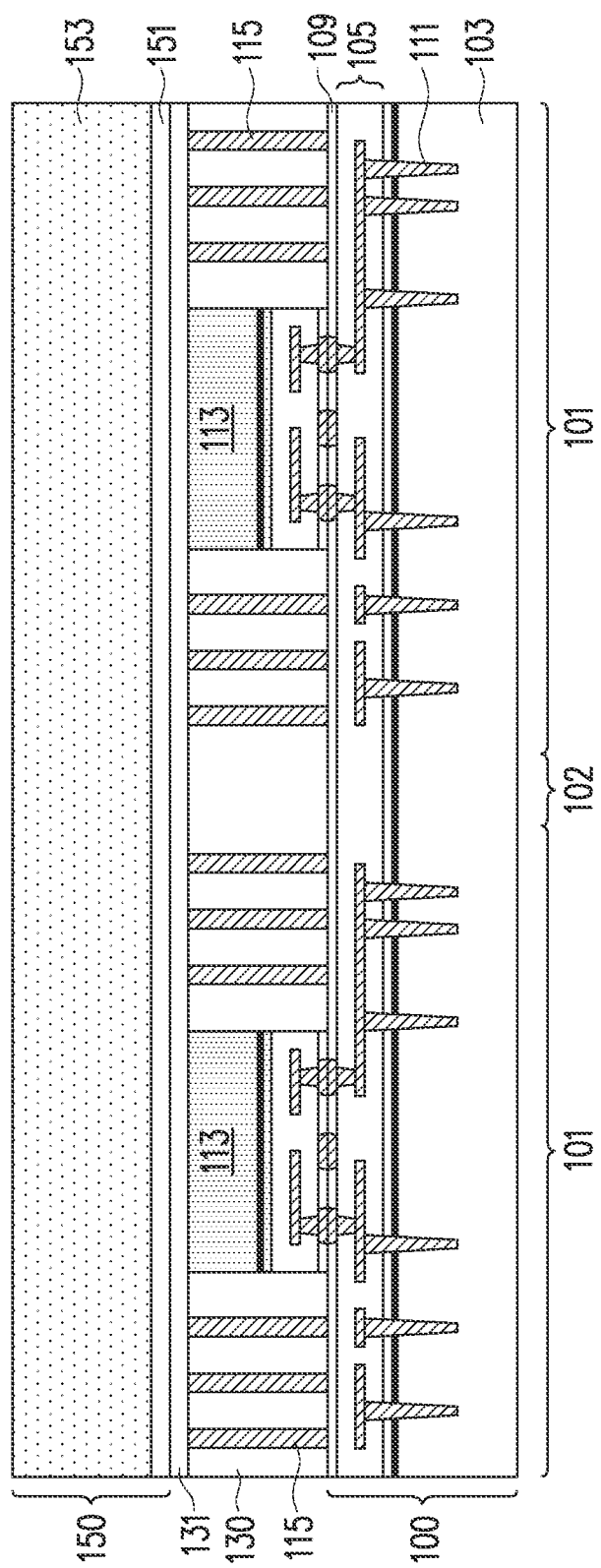

FIGS. 5 and 6 illustrate the attachment of a support structure 150, in accordance with some embodiments. The support structure 150 may be attached to the structure of FIG. 4 to provide support and reduce warping or cracking of the final package (e.g., the device package 200 shown in FIGS. 9A-9B). In some embodiments, a package bonding layer 131 may be formed over the second semiconductor devices 113, the thermal structures 115, and the encapsulant 130 prior to attachment of the support structure 150. The package bonding layer 131 may be used for bonding to the support structure 150. For example, the package bonding layer 131 may be used for a bonding process such as direct bonding, fusion bonding, dielectric-to-dielectric bonding, oxide-to-oxide bonding, or the like. In accordance with some embodiments, the package bonding layer 131 is similar to the first wafer bond layer 109 or the second wafer bond layers 121 described previously. For example, the package bonding layer 131 may be formed of a silicon-containing dielectric material such as silicon oxide, silicon nitride, or the like, and deposited using ALD, CVD, PVD, or the like. Other materials or deposition techniques are possible.

In some embodiments, the support structure 150 may comprise a support bonding layer 151 on a support substrate 153. In other embodiments, the support structure 150 may further comprise a conductive support bonding material 155, examples of which are described below for FIGS. 12-16. The support substrate 153 may be a semiconductor material such as silicon (e.g., bulk silicon, a silicon wafer, or the like), a glass material, a metal material, or the like. The support bonding layer 151 may be used for bonding the support structure 150 to the package bonding layer 131. For example, the support bonding layer 151 may be used for a bonding process such as direct bonding, fusion bonding, dielectric-to-dielectric bonding, oxide-to-oxide bonding, or the like. In accordance with some embodiments, the support bonding layer 151 is similar to the first wafer bond layer 109, the second wafer bond layers 121, or the package bonding layer 131 described previously. For example, the support bonding layer 151 may be formed of a silicon-containing dielectric material such as silicon oxide, silicon nitride, or the like, and deposited using ALD, CVD, PVD, or the like. Other materials or deposition techniques are possible.

Turning to FIG. 6, the support bonding layer 151 of the support structure 150 is bonded to the package bonding layer 131, in accordance with some embodiments. The support bonding layer 151 may be bonded to the package bonding layer 131 using techniques similar to those described previously for bonding the first wafer bond layer 109 of the first semiconductor devices 101 to the second wafer bond layers 121 of the second semiconductor devices 113. For example, an activation process may first be performed on the package bonding layer 131 and/or the support bonding layer 151. The support bonding layer 151 may then be placed into contact with the package bonding layer 131. In some cases, the bonding process between the bonding surfaces begins as the bonding surfaces physically contact each other. In some embodiments, a thermal treatment is performed after the bonding surfaces are in physical contact. The thermal treatment may include a process temperature in the range of about 200° C. to about 400° C., though other temperatures are possible.

In other embodiments, the support structure 150 may be attached using an adhesive (not separately illustrated). For example, an adhesive material may be deposited prior to placement of the support structure 150. The adhesive material may be deposited over a surface of the support substrate 153 and/or over surfaces of the second semiconductor devices 113, the thermal structures 115, and the encapsulant 130. In some embodiments in which an adhesive material is used to attach the support structure 150, the package bonding layer 131 and/or the support bonding layer 151 may not be present.

Figure 7:
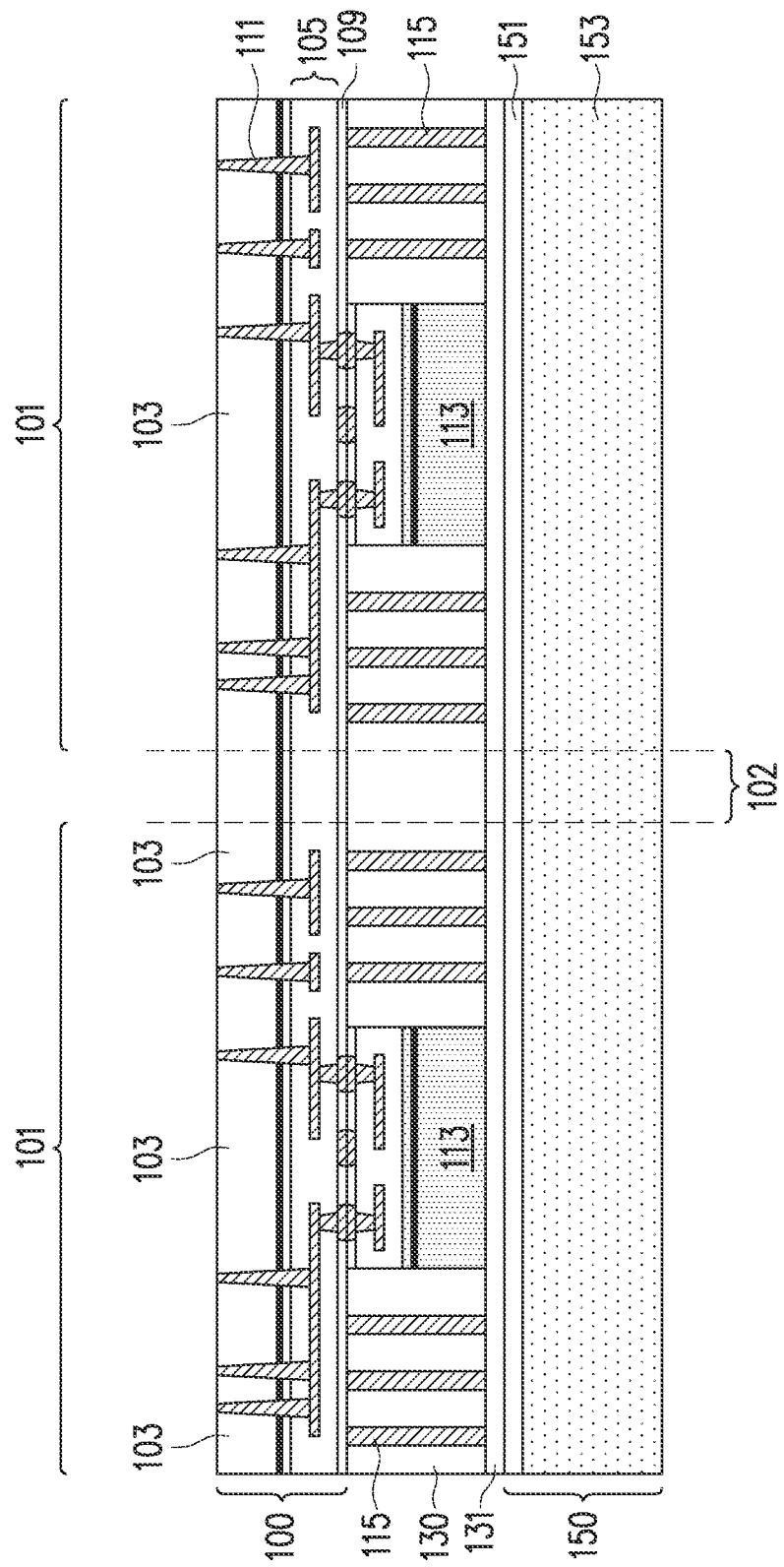

In FIG. 7, the structure is flipped upside down and the first substrate 103 is thinned to expose the TSVs 111, in accordance with some embodiments. The first substrate 103 may be thinned using a planarization process such as a CMP process, a grinding process, an etching process, the like, or a combination thereof. Other techniques are possible. After exposing the TSVs 111, top surfaces of the TSVs 111 and the first substrate 103 may be substantially level or coplanar.

Figure 8:
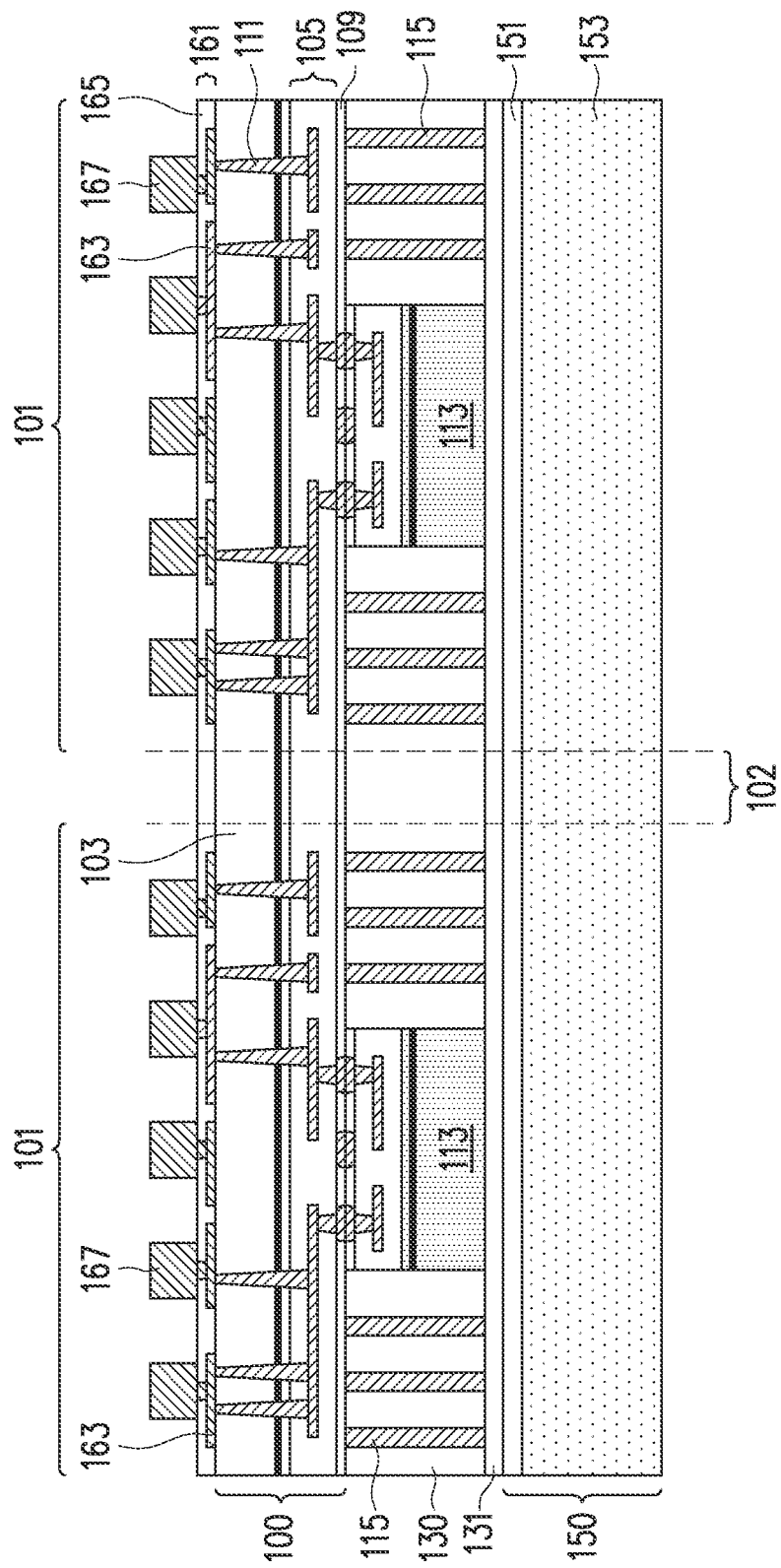

FIG. 8 illustrates a formation of a redistribution structure 161 over the TSVs 111, in accordance with some embodiments. The redistribution structure 161 may be formed over the thinned side of the first substrate 103 to make physical and electrical connection with the TSVs 111. The redistribution structure 161 may comprise one or more redistribution layers and one or more passivation layers. In an embodiment, the redistribution structure 161 may be formed by initially forming a redistribution layer 163 over the first substrate 103. Portions of the redistribution layer 163 extend on and make electrical contact to the TSVs 111. In an embodiment, the redistribution layer 163 may be formed by initially forming a seed layer (not shown) of a titanium copper alloy or the like using a suitable formation process such as CVD, sputtering, or the like. A photoresist (also not shown) may then be formed to cover the seed layer, and the photoresist may then be patterned to expose portions of the seed layer corresponding to the redistribution layer 163.

Once the photoresist has been formed and patterned, a conductive material, such as copper or the like, may be formed on the seed layer using a deposition process such as electroplating, electroless plating, or the like. The conductive material may be formed to have a thickness of between about 1 μm and about 10 μm, such as about 4 μm. This is an example, and any other suitable materials and any other suitable processes of formation may be used to form the redistribution layer 163. Once the conductive material has been deposited, the photoresist may be removed through a suitable removal process such as chemical stripping and/or ashing. Additionally, after the removal of the photoresist, portions of the seed layer that were previously covered by the photoresist may be removed using, for example, a suitable etch process.

In some embodiments, a passivation layer 165 may be formed over the redistribution layer 163. The passivation layer 165 may be a material such as polybenzoxazole (PBO), a polyimide, a polyimide derivative, or the like. The passivation layer 165 may be formed using a spin-on process or another suitable technique. The passivation layer 165 may be formed having a thickness in the range of about 5 μm to about 17 μm, though other thicknesses are possible. The passivation layer 165 may then be patterned to allow for electrical contact to the underlying redistribution layer 163. In an embodiment, the passivation layer 165 may be patterned using a suitable photolithographic masking and etching process. However, any suitable process may be utilized to expose the underlying redistribution layer 163.

In some embodiments, additional redistribution layers and passivation layers may be formed to provide additional interconnections within the redistribution structure 161. In particular, any suitable number of redistribution layers and passivation layers may be formed using the processes and materials described herein. All such layers and combinations of layers are fully intended to be included within the scope of the embodiments.

Once the passivation layer 165 has been formed and patterned, external connectors 167 may be formed, in accordance with some embodiments. The external connectors 167 are electrically connected to the redistribution structure 161. In an embodiment, the external connectors 167 may be conductive pads or conductive pillars, such as copper pads or copper pillars. In an embodiment, the external connectors 167 may be formed by initially forming a seed layer and then forming a patterned photoresist over the seed layer. A conductive material may then be deposited on exposed portions of the seed layer using a process such as electroplating, electroless plating, or the like. After deposition of the conductive material, the photoresist is removed and the seed layer is removed using the conductive material as an etching mask. In some embodiments, optional conductive connectors 169 comprising a solder material or another material may be formed on the external connectors 167. Conductive connectors 169 are described in greater detail below for the embodiment shown in FIG. 11.

Figure 9A:
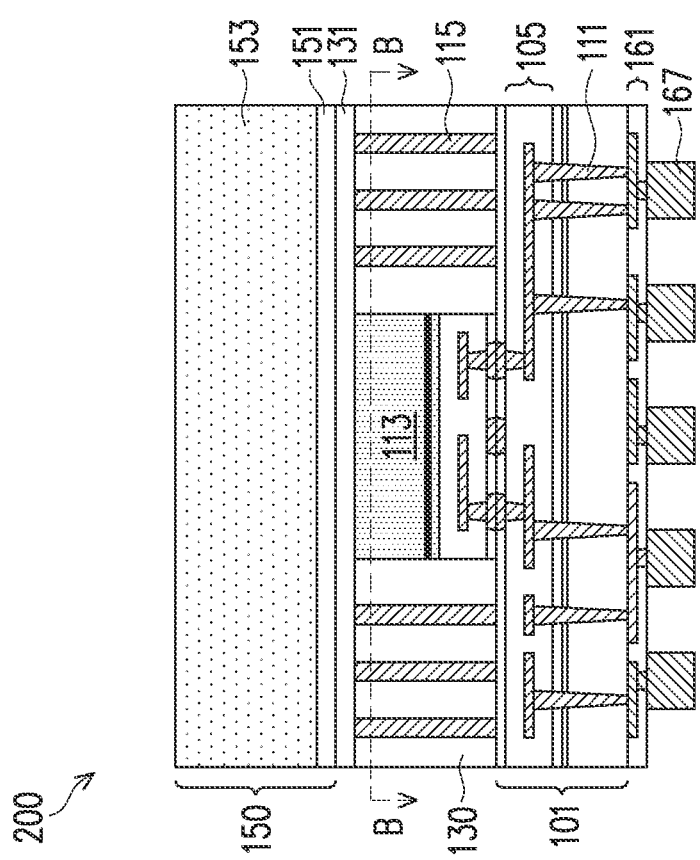
Figure 9B:
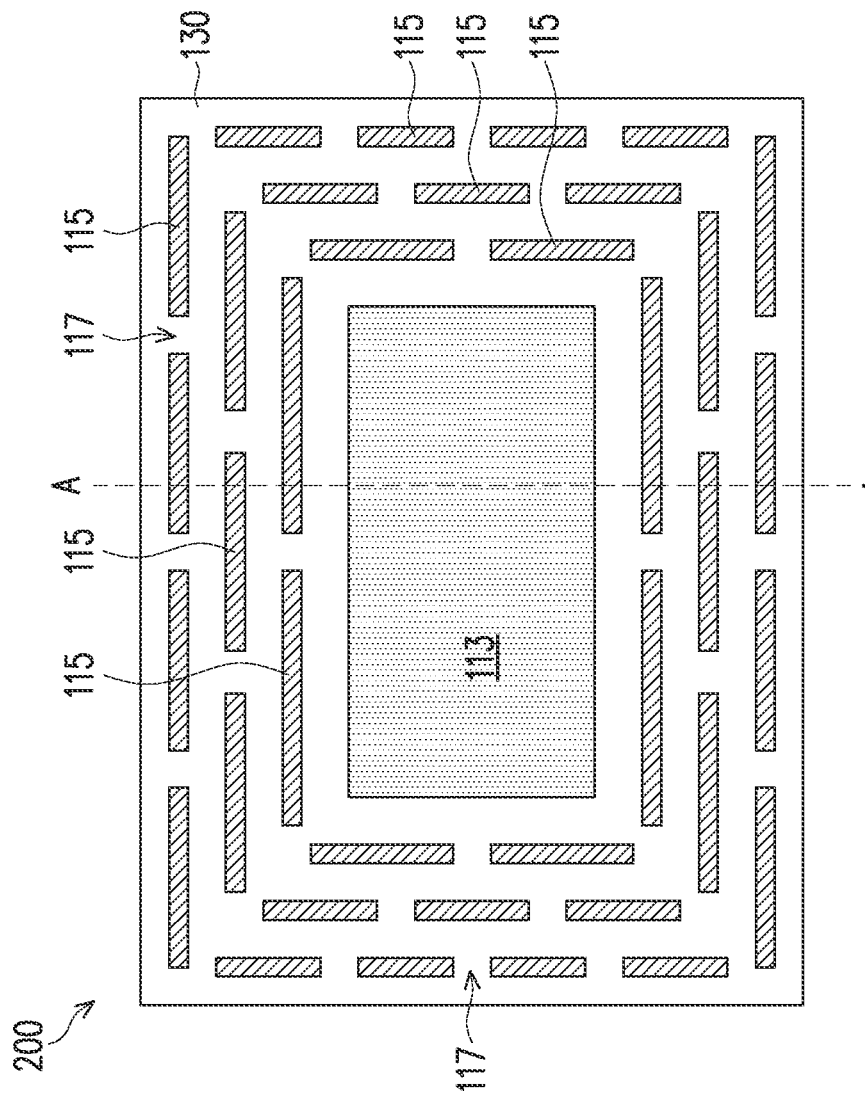

FIGS. 9A and 9B illustrate cross-sectional views of a device package 200 after a singulation process has been performed, in accordance with some embodiments. FIG. 9A is illustrated along the cross-section A-A shown in FIG. 9B, and FIG. 9B is illustrated along the cross-section B-B shown in FIG. 9A. In some embodiments, after formation of the external connectors 167 described above for FIG. 8, a singulation process may be performed by sawing along scribe regions 102, e.g., between adjacent first semiconductor devices 101. The sawing singulates the structure into individual device packages 200, one of which is shown in FIGS. 9A-9B.

As shown in FIGS. 9A-9B, the device package 200 includes one or more thermal structures 115 within the encapsulant 130 and disposed between the second semiconductor device 113 and the sidewalls of the device package 200 (e.g., the exposed sidewalls of the encapsulant 130). The thermal structures 115 have a relatively high thermal conductivity and thus can allow for the improved transfer of heat away from the first semiconductor device 101 and the second semiconductor device 113. In this manner, thermal effects due to heating can be reduced, which can improve device operation and reliability. The higher thermal conductivity of the thermal structures 115 can allow for more flexibility in the selection of the material of the encapsulant 130, in some cases. The thermal structures 115 are electrically isolated from the first semiconductor device 101, the second semiconductor device 113, and any other electrical features within the device package 200. In this manner, the thermal structures 115 can be configured to provide desired heat dissipation properties without affecting semiconductor device design or electrical feature design, in some cases. In some cases, the thermal structures 115 may be considered "dummy structures" or "dummy electrical features."

Figure 10:
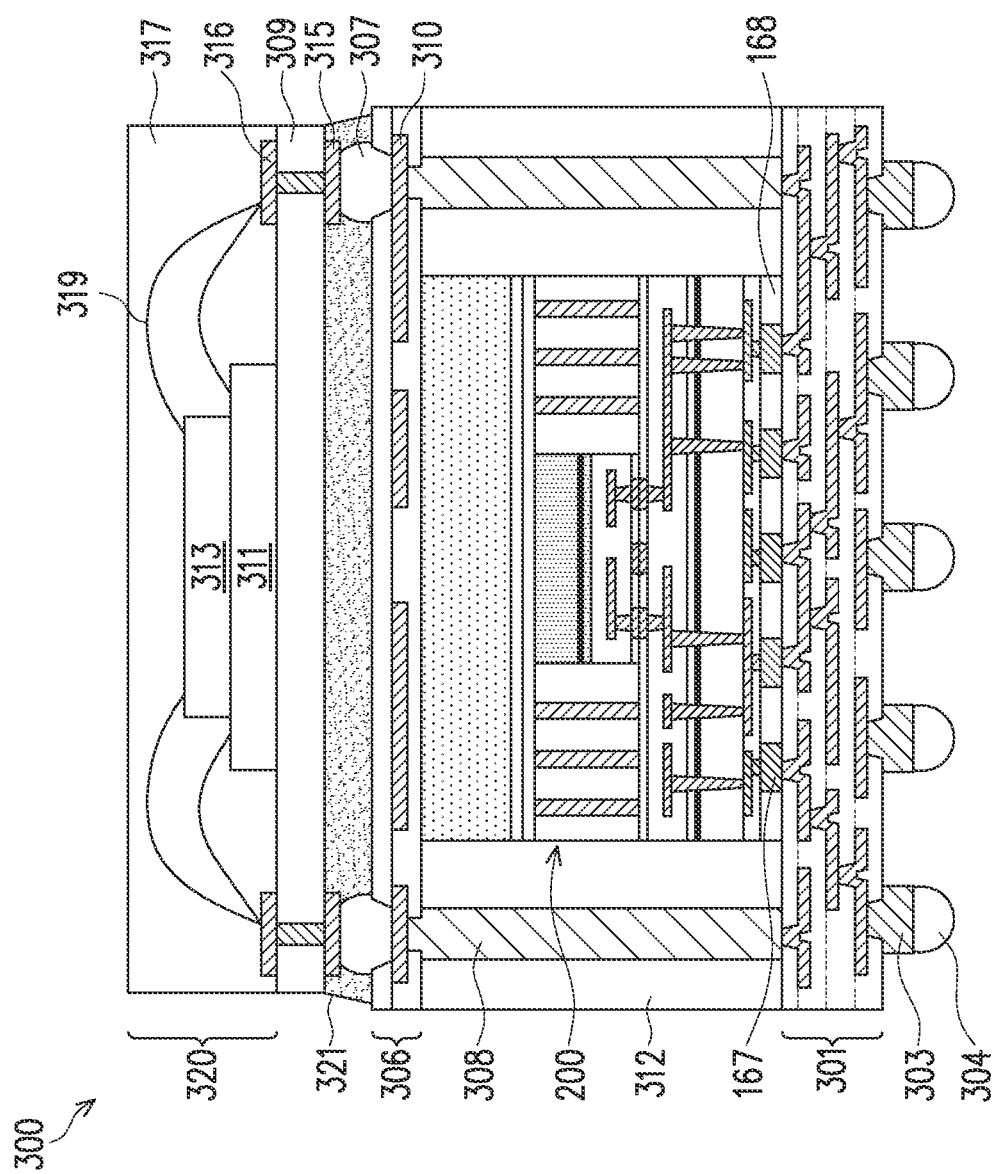
FIG. 10 illustrates a cross-sectional view of an intermediate step during a process for forming a package including a device package, in accordance with some embodiments.
Figure 11:
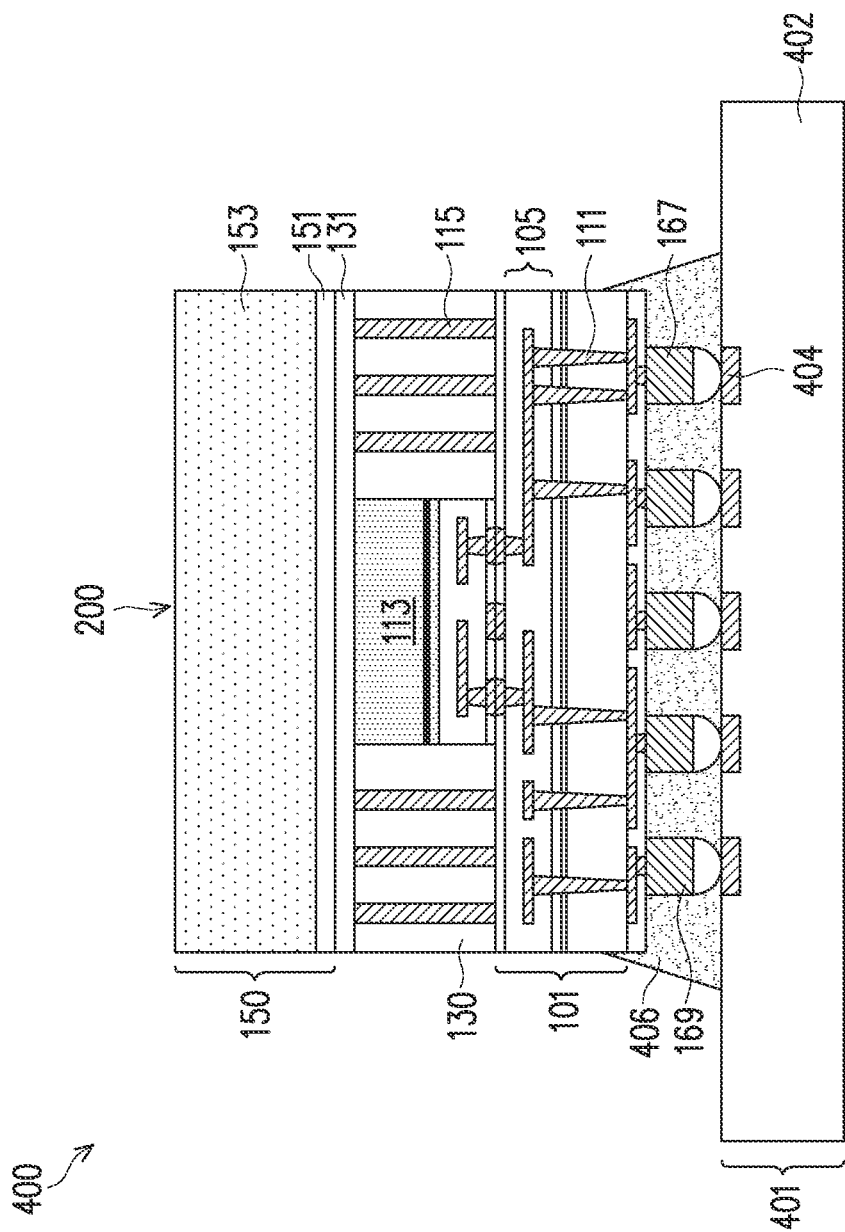
FIG. 11 illustrates a cross-sectional view of an intermediate step during a process for forming a package including a device package, in accordance with some embodiments.

FIGS. 10 and 11 illustrate that, once the singulated device package 200 has been formed, the device package 200 may be further packaged or incorporated into a package structure, in accordance with some embodiments. As an example, FIG. 10 illustrates a package structure 300 that incorporates a device package 200 using an integrated fan-out ("InFO") process to integrate the device package 200 with other devices. The package structure 300 is an example, and other package structures or other techniques for forming a package structure are possible.

As an example process for forming the package structure 300, a back-side redistribution structure 306 may first be formed on a carrier (not separately illustrated). The back-side redistribution structure 306 may be formed using materials and techniques similar to those of the redistribution structure 161 described previously for FIG. 8. For example, the back-side redistribution structure 306 may be formed by depositing a first dielectric layer over the carrier, forming a redistribution layer 310 (sometimes referred to as metallization patterns or redistribution lines) on the first dielectric layer, and then forming a second dielectric layer over the first dielectric layer and the redistribution layer 310. Openings are formed in the second dielectric layer so that through vias 308 (described below) are able to make physical and electrical contact with the redistribution layer 310. The back-side redistribution structure 306 is optional. In some embodiments, a dielectric layer without redistribution layers is formed on the carrier in lieu of the back-side redistribution structure 306.

In some embodiments, the first dielectric layer is formed of a polymer, such as polybenzoxazole (PBO), polyimide, benzocyclobutene (BCB), or the like. In other embodiments, the first dielectric layer is formed of a nitride such as silicon nitride; an oxide such as silicon oxide, phosphosilicate glass (PSG), borosilicate glass (BSG), boron-doped phosphosilicate glass (BPSG), or the like; or the like. The first dielectric layer may be formed by any acceptable deposition process, such as spin coating, CVD, laminating, the like, or a combination thereof.

The redistribution layer 310 may be formed on the first dielectric layer. As an example to form redistribution layer 310, a seed layer is formed over the first dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the redistribution layer 310. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the redistribution layer 310.

The second dielectric layer may be formed on the redistribution layer 310 and the first dielectric layer. In some embodiments, the second dielectric layer is formed of a material similar to those described for the first dielectric layer, which may be formed using a technique similar to those described for the first dielectric layer. The second dielectric layer is then patterned to form openings exposing portions of the redistribution layer 310. The patterning may be formed by an acceptable process, such as by exposing the second dielectric layer to light when the second dielectric layer is a photo-sensitive material or by etching using, for example, an anisotropic etch. If the second dielectric layer is a photo-sensitive material, the second dielectric layer can be developed after the exposure.

FIG. 10 illustrates a redistribution structure 306 having a single redistribution layer 310 for illustrative purposes. In some embodiments, the back-side redistribution structure 306 may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

Through vias 308 may then be formed on the metallization pattern 310 through the openings in the second dielectric layer and extending away from the back-side redistribution structure 306. As an example to form the through vias 308, a seed layer (not shown) is formed over the back-side redistribution structure 306, e.g., on the second dielectric layer and portions of the redistribution layer 310 exposed by the openings. A photoresist is formed and patterned on the seed layer. The photoresist is then patterned to form openings that expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 308.

After forming the through vias 308, a device package 200 may be placed on the redistribution structure 306 using, for example, a pick-and-place process. In some embodiments, the device package 200 is attached to the redistribution structure 306 by an adhesive (not separately illustrated). In other embodiments, one or more other devices may be placed on the redistribution structure 306 in addition to the device package 200.

In some embodiments, before placing the device package 200, a passivation layer 168 may be formed on the redistribution structure 161 and around the external connectors 167 of the device package 200. In some embodiments, the passivation layer 168 may be made of one or more suitable dielectric materials such as silicon oxide, silicon nitride, polybenzoxazole (PBO), polyimide, or the like. The passivation layer 168 may be formed using a process such as CVD, PVD, ALD, combinations of these, or the like. Other materials or processes are possible. After forming the external connectors 167 and the passivation layer 168, a planarization process may be performed. After performing the planarization process, top surfaces of the external connectors 167 and the passivation layer 168 may be coplanar. In other embodiments, the passivation layer 168 is formed on the redistribution structure 161 before forming the external connectors 167. In such embodiments, the passivation layer 168 may be patterned to form openings corresponding to the external connectors 167, and then the external connectors 167 formed by depositing conductive material(s) in the openings.

The through vias 308 and the device package 200 may then be encapsulated by forming an encapsulant 312 on and around the various components. The encapsulant 312 may be similar to the encapsulant 130 described previously, and similar encapsulation techniques may be used. For example, the encapsulant 312 may be a molding compound, an epoxy, or the like, and may be cured. After encapsulation, a planarization process may be performed to expose the through vias 308 and the external connectors 167 of the device package 200. After planarization, top surfaces of the through vias 308 and the external connectors 167 may be coplanar.

In some embodiments, a front-side redistribution structure 301 may be formed over the encapsulant 312, the through vias 308, and the device package 200. The front-side redistribution structure 301 may comprise one or more redistribution layers and one or more passivation layers, and may be formed using materials or processes similar to those described previously for the redistribution structure 161 (see FIG. 8) or the back-side redistribution structure 306. For example, a passivation layer may be deposited and patterned and a seed layer deposited over the patterned passivation layer. A photoresist may then be deposited and patterned over the seed layer, and a redistribution layer formed by depositing conductive material on exposed regions of the seed layer. The photoresist and underlying regions of the seed layer may then be removed. This process may be repeated to form a front-side redistribution structure 301 comprising one or more redistribution layers. The front-side redistribution structure 301 may have a different number of layers than shown in FIG. 10, which may be formed using any suitable materials or processes.

Under-bump Metallizations (UBMs) 303 may then be formed for external connection to the front-side redistribution structure 301. The UBMs 303 have bump portions on and extending along the major surface of the front-side redistribution structure 301, and have via portions extending through the top-most passivation layer to physically and electrically contact the top-most redistribution layer. As a result, the UBMs 303 are electrically coupled to the through vias 308 and the device package 200. The UBMs 303 may be formed of the same material as the redistribution layers of the front-side redistribution structure 301, though other materials or combinations of materials are possible.

Conductive connectors 304 may then be formed on the UBMs 303, in some embodiments. The conductive connectors 304 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 304 may include a conductive material such as solder, copper, aluminum, gold, nickel, silver, palladium, tin, the like, or a combination thereof. In some embodiments, the conductive connectors 304 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 304 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Conductive connectors 307 are then formed extending through the first dielectric layer of the back-side redistribution structure 306 to contact the redistribution layer 310. For example, openings may be formed through the first dielectric layer to expose portions of the redistribution layer 310. The openings may be formed, for example, using laser drilling, etching, or the like. The conductive connectors 307 are then formed in the openings. In some embodiments, the conductive connectors 307 comprise flux and are formed in a flux dipping process. In some embodiments, the conductive connectors 307 comprise a conductive paste such as solder paste, silver paste, or the like, and are dispensed in a printing process. In some embodiments, the conductive connectors 307 are formed in a manner similar to the conductive connectors 304, and may be formed of a similar material as the conductive connectors 304.

A package component 320 may then be connected to the conductive connectors 307. The package component 320 may comprise one or more dies on a substrate 309. For example, the package component 320 shown in FIG. 10 comprises stacked dies 311 and 313 on the substrate 309. The dies may be semiconductor devices designed for an intended purpose such as being a logic die, a central processing unit (CPU) die, a memory die (e.g., a DRAM die), combinations of these, or the like. The semiconductor devices may be other types of devices, such as those described for the first semiconductor device 101 or the second semiconductor device 113.

The substrate 309 may be a suitable material, such as a semiconductor substrate (e.g., silicon or another semiconductor), a glass substrate, a ceramic substrate, a polymer substrate, an organic substrate, the like, or any other suitable substrate. The substrate 309 may have conductive pads 316 on a first side of the substrate 309 to couple to the stacked dies 311/313, and conductive pads 315 on a second side of the substrate 309, the second side being opposite the first side of the substrate 309, to couple to the conductive connectors 307. The conductive pads 315 and the conductive pads 316 may be electrically interconnected by through vias that extend through the substrate 309. In some embodiments, the stacked dies 311/313 are electrically connected to the conductive pads 316 by wire bonds 319. The stacked dies 311/313 and the wire bonds 319 may be encapsulated by a molding material 317. In some embodiments, the molding material 317 comprises an encapsulant, a molding compound, a polymer, an epoxy, a silicon oxide filler material, the like, or a combination thereof.

The conductive pads 315 of the package component 320 may be physically and electrically bonded to the conductive connectors 307. For example, the conductive pads 315 may be placed into physical contact with the conductive connectors 307 and then reflow process may be performed. In some embodiments, an underfill 321 may be formed between the redistribution structure 306 and the package component 320. The underfill 321 may surround and protect the conductive connectors 307, in some cases.

FIG. 11 illustrates a package structure 400 that incorporates a device package 200, in accordance with some embodiments. As an example process for forming the package structure 300, conductive connectors 169 may first be formed on the external connectors 167 of the device package 200. The conductive connectors 169 may be similar to the conductive connectors 304 described previously for FIG. 10, and may be formed using similar techniques. For example, the conductive connectors 169 may be solder balls, solder bumps, or the like formed using evaporation, electroplating, printing, solder transfer, ball placement, or the like. A reflow may be performed in order to shape the material into the desired bump shapes. Other materials or techniques are possible.

The device package 200 may be mounted to a package substrate 401 using the conductive connectors 169. The package substrate 401 may comprise, for example, a substrate core 402 and bond pads 404 over the substrate core 402. The substrate core 402 may be made of a semiconductor material such as silicon, germanium, diamond, or the like. Other semiconductor materials are possible. Additionally, the substrate core 402 may be an SOI substrate. Generally, an SOI substrate includes a layer of a semiconductor material such as epitaxial silicon, germanium, silicon germanium, SOI, SGOI, or combinations thereof. The substrate core 402 may comprise other materials, such as PCB materials, organic materials, build-up films, laminates, the like, or another material. The substrate core 402 may include active or passive devices (not shown), or may be substantially free of active or passive devices. The substrate core 402 may also include metallization layers and vias (not shown), with the bond pads 404 being physically and/or electrically coupled to the metallization layers and vias. In other embodiments, surface mount devices (SMDs), integrated passive devices (IPDs), or the like may also be connected to the package substrate 401.

In some embodiments, the conductive connectors 169 are reflowed to attach the device package 200 to the bond pads 404. The conductive connectors 169 electrically and/or physically couple the package substrate 401, including metallization layers in the substrate core 402, to the device package 200. In some embodiments, an underfill 406 may be formed between the device package 200 and the package substrate 401 and surrounding the conductive connectors 169. The underfill 406 may be formed by a capillary flow process after the device package 200 is attached or may be formed by a suitable deposition method before the device package 200 is attached.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 12, 13, 14, 15, and 16 respectively illustrate cross-sectional views of example device packages 212, 213, 214, 215, and 216, in accordance with some embodiments. FIGS. 12 through 16 are illustrated along a cross-sectional view similar to that of FIG. 9A. The device packages 212-216 are similar to the device package 200 shown in FIG. 9A, except the device packages 212-216 comprise conductive package bonding material 135 formed in the package bonding layer 131 and conductive support bonding material 155 formed in the support bonding layer 151. In some cases, the conductive material of the conductive package bonding material 135 and the conductive support bonding material 155 may have a relatively high thermal conductivity that provides improved heat dissipation, which may be in addition to improved heat dissipation provided by the thermal structures 115. In some embodiments, the conductive package bonding material 135 and the conductive support bonding material 155 are electrically isolated from the first semiconductor device 101, the second semiconductor device 113, and any other electrical features. In some cases, the conductive package bonding material 135 and the conductive support bonding material 155 may be considered "dummy structures" or "dummy electrical features."

In some embodiments, the conductive package bonding material 135 and the conductive support bonding material 155 are used as part of the bonding of the support structure 150. In this manner, the bonding of the support structure 150 may include a combination of dielectric-to-dielectric bonding and metal-to-metal bonding (e.g., "hybrid bonding"). For example, the support bonding layer 151 may be bonded to the package bonding layer 131 using dielectric-to-dielectric bonding, and the conductive support bonding material 155 may be bonded to the conductive package bonding material 135 using metal-to-metal bonding. The bonding process may be similar to the bonding process described for bonding the second semiconductor devices 113 bonded to the first semiconductor devices 101, described previously for FIG. 1A. For example, an activation process may first be performed on the support bonding layer 151, the conductive support bonding material 155, the package bonding layer 131, and/or the conductive package bonding material 135, in some embodiments. The conductive support bonding material 155 may then be placed into physical contact with the conductive package bonding material 135 while the support bonding layer 151 is placed into physical contact with the package bonding layer 131. In some cases, the bonding process between bonding surfaces begins as the bonding surfaces physically contact each other. In some embodiments, a thermal treatment is performed after the bonding surfaces are in physical contact. The thermal treatment may include a process temperature in the range of about 200° C. to about 400° C., though other temperatures are possible. Other bonding techniques are possible.

Figure 12:
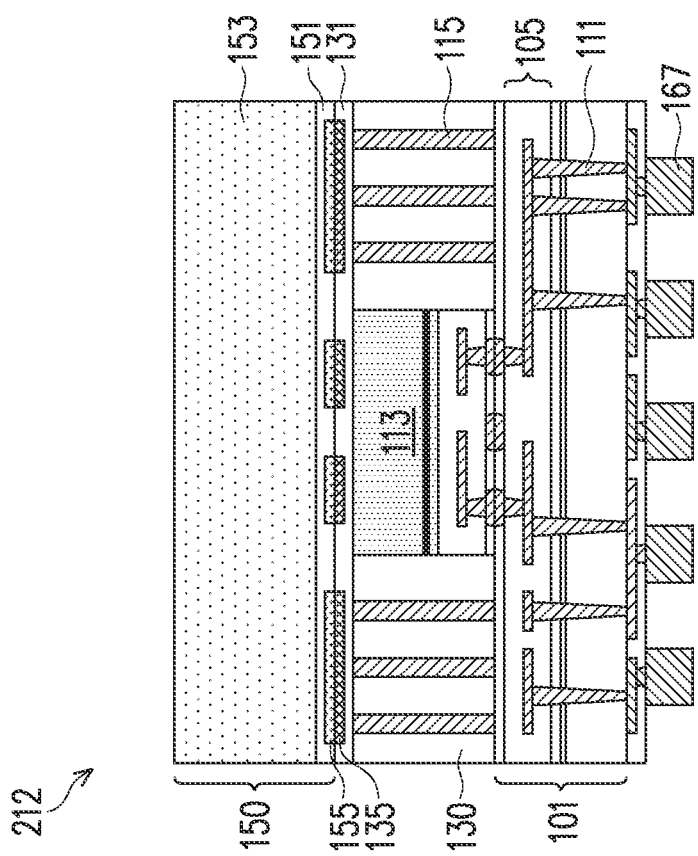
FIGS. 12, 13, 14, 15, and 16 illustrate cross-sectional views of different device packages, in accordance with some embodiments.

FIG. 12 illustrates a device package 212, in accordance with some embodiments. As described previously, the device package 212 is similar to the device package 200 except that, prior to bonding the support structure 150, conductive package bonding material 135 is formed in the package bonding layer 131 and conductive support bonding material 155 is formed in the support bonding layer 151. The conductive package bonding material 135 and the conductive support bonding material 155 may be formed using any suitable technique, such as damascene, dual damascene, or the like. As an example, the conductive package bonding material 135 may be formed by first forming recesses (not separately illustrated) within the package bonding layer 131. In an embodiment, the recesses may be formed by first applying and patterning a photoresist over the top surface of the package bonding layer 131. The package bonding layer 131 is then etched using the patterned photoresist as an etching mask in order to form the recesses. The package bonding layer 131 may be etched by dry etching (e.g., reactive ion etching (RIE) or neutral beam etching (NBE)), wet etching, or the like. In some embodiments, the recesses extend partially through the package bonding layer 131. Other techniques of forming the recesses are possible.

The conductive package bonding material 135 may then be formed in the recesses in the package bonding layer 131. In some embodiments, the conductive package bonding material 135 may comprise a barrier layer, a seed layer, a fill metal, or a combination thereof. For example, the barrier layer may first be blanket deposited over the package bonding layer 131. The barrier layer may comprise titanium, titanium nitride, tantalum, tantalum nitride, the like, or a combination thereof. The seed layer may be a conductive material such as copper and may be blanket deposited over the barrier layer using a suitable process, such as sputtering, evaporation, PECVD, or the like. The fill metal may be a conductive material such as copper or a copper alloy and may be deposited using a suitable process, such as electroplating, electroless plating, or the like. The fill metal may fill or overfill the recesses, in some embodiments. Once the fill metal has been deposited, excess material of the fill metal, the seed layer, and the barrier layer may be removed using, for example, a planarization process such as chemical mechanical polishing (CMP). After the planarization process, top surfaces of the conductive package bonding material 135 and the package bonding layer 131 may be substantially level or coplanar, in some cases. Other techniques for forming the conductive package bonding material 135 are possible.

The conductive support bonding material 155 may be formed in the support bonding layer 151 using similar techniques. For example, recesses may be patterned in the support bonding layer 151 and the conductive support bonding material 155 may be deposited on the support bonding layer 151. In some embodiments, the recesses extend partially through the support bonding layer 151. In some embodiments, the conductive support bonding material 155 may comprise a barrier layer, a seed layer, a fill metal, or a combination thereof. A planarization process may be performed and top surfaces of the conductive support bonding material 155 and the support bonding layer 151 may be substantially level or coplanar, after the planarization process, in some cases. Other techniques for forming the conductive support bonding material 155 are possible. In some embodiments, the conductive package bonding material 135 may have a thickness in the range of about 100 nm to about 1000 nm, and the conductive support bonding material 155 may have a thickness in the range of about 100 nm to about 1000 nm. Other thicknesses are possible.

Figure 13:
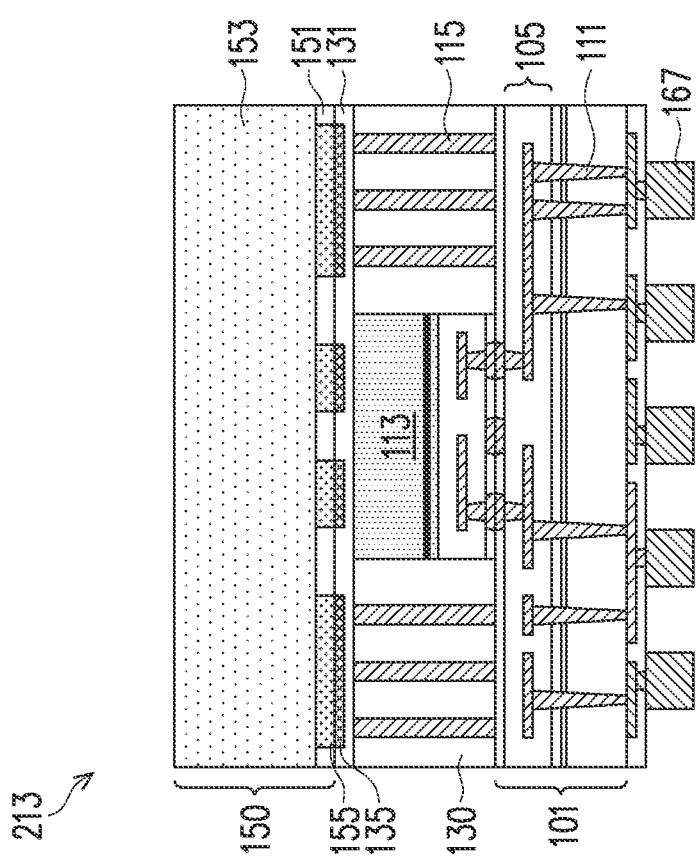

FIG. 13 illustrates a device package 213, in accordance with some embodiments. The device package 213 is similar to the device package 212 shown in FIG. 12, except that the conductive support bonding material 155 extends fully through the support bonding layer 151. The conductive support bonding material 155 may be formed, for example, by forming recesses that extend fully through the support bonding layer 151. In some embodiments, the recesses expose the support substrate 153. The conductive support bonding material 155 may then be deposited into the recesses. In some embodiments, the conductive support bonding material 155 physically contacts the support substrate 153. In some embodiments, the conductive support bonding material 155 may have a thickness in the range of about 100 nm to about 1000 nm. Other thicknesses are possible. In some cases, heat dissipation may be improved by the use of a thicker conductive support bonding material 155 or a conductive support bonding material 155 that physically contacts the support substrate 153.

Figure 14:
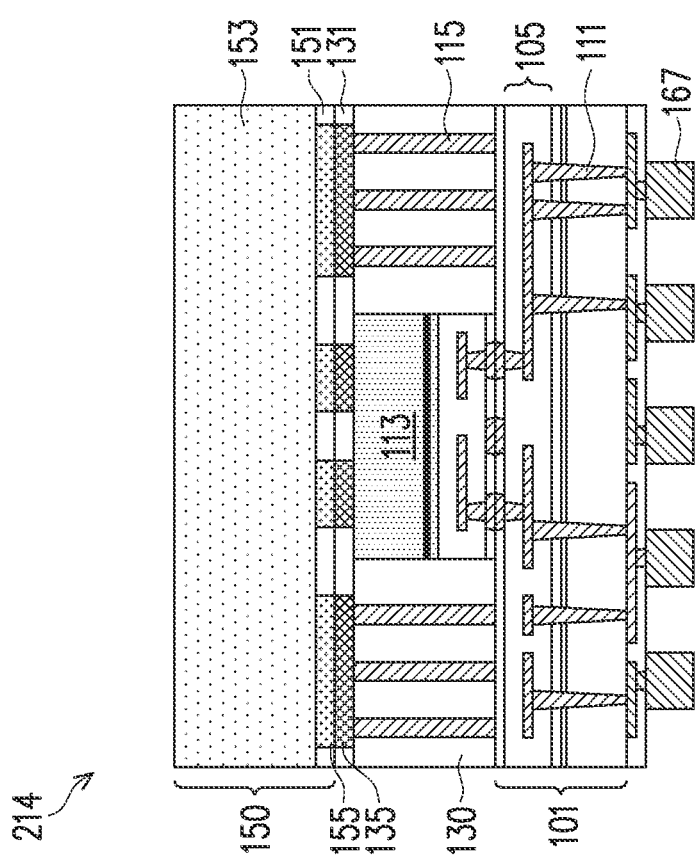

FIG. 14 illustrates a device package 214, in accordance with some embodiments. The device package 214 is similar to the device package 213 shown in FIG. 13, except that the conductive support bonding material 155 extends fully through the support bonding layer 151 and the conductive package bonding material 135 extends fully through the package bonding layer 131. The conductive package bonding material 135 may be formed, for example, by forming recesses that extend fully through the package bonding layer 131. In some embodiments, the recesses expose the second semiconductor device 113, the thermal structures 115, and/or the encapsulant 130. The conductive support bonding material 155 may then be deposited into the recesses. In some embodiments, the conductive support bonding material 155 physically contacts the second semiconductor device 113, the thermal structures 115, and/or the encapsulant 130. The conductive package bonding material 135 and the conductive support bonding material 155 may have similar thicknesses or different thicknesses. In some embodiments, the conductive package bonding material 135 may have a thickness in the range of about 100 nm to about 1000 nm. Other thicknesses are possible. In some cases, heat dissipation may be improved by the use of a thicker conductive package bonding material 135 or a conductive package bonding material 135 that physically contacts the second semiconductor device 113, the thermal structures 115, or the encapsulant 130.

Figure 15:
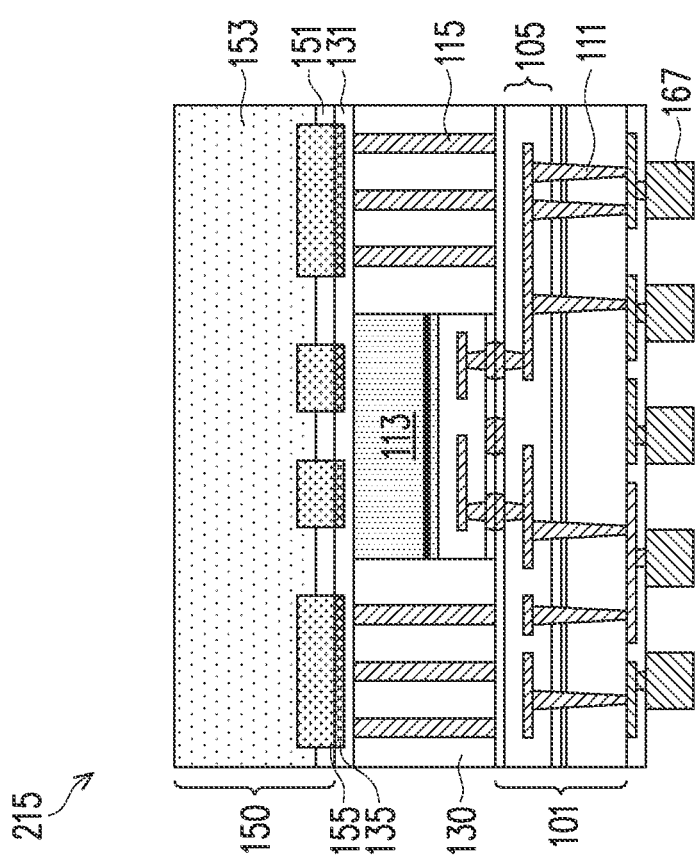
Figure 16:
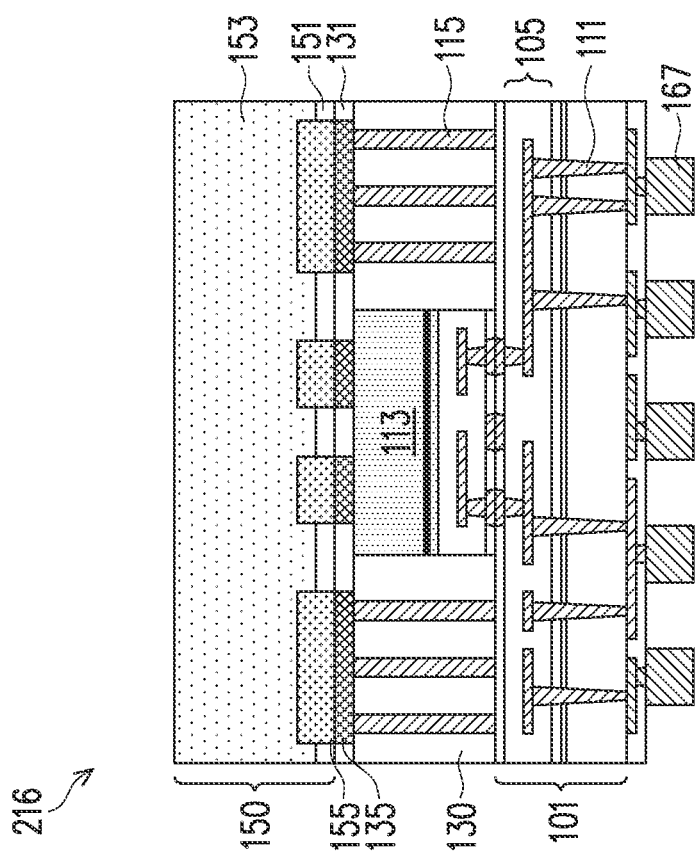

FIG. 15 illustrates a device package 215, in accordance with some embodiments. The device package 215 is similar to the device package 213 shown in FIG. 13, except that the conductive support bonding material 155 extends fully through the support bonding layer 151 and protrudes into the support substrate 153. FIG. 16 illustrates a device package 216 that is similar to the device package 214 shown in FIG. 14, except that the conductive support bonding material 155 extends fully through the support bonding layer 151 and into the support substrate 153. The conductive support bonding material 155 of device packages 215 and 216 may be formed, for example, by extending the recesses fully through the support bonding layer 151 and extended a depth into the support substrate 153. The recesses may have a depth in the range of about 200 nm to about 1000 nm from the surface of the support substrate 153, though other depths are possible. The recesses may be extended into the support substrate 153 using a suitable wet etch and/or dry etch. The conductive support bonding material 155 may then be deposited into the recesses. In some embodiments, the conductive support bonding material 155 may have a thickness in the range of about 300 nm to about 2000 nm. Other thicknesses are possible. In some cases, heat dissipation may be improved by the use of a thicker conductive support bonding material 155 or a conductive support bonding material 155 that protrudes into the support substrate 153.

Figure 17:
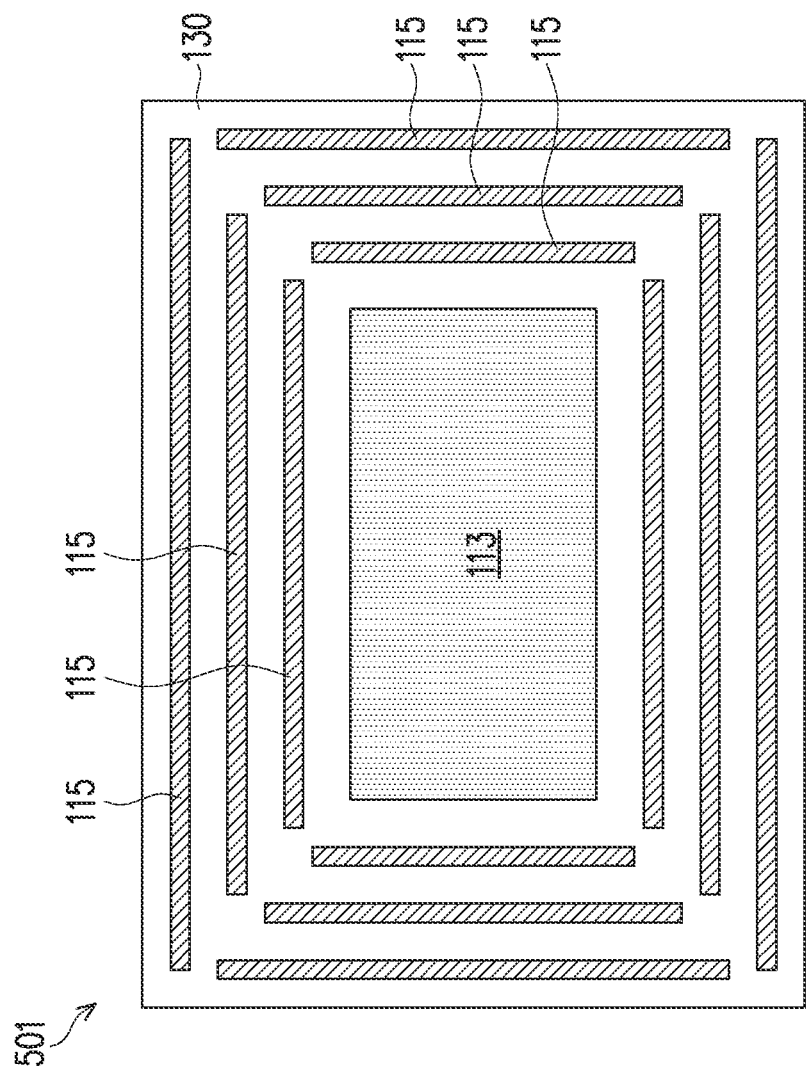
FIGS. 17, 18, and 19 illustrate plan views of different device packages having different configurations of thermal structures, in accordance with some embodiments.
Figure 18:
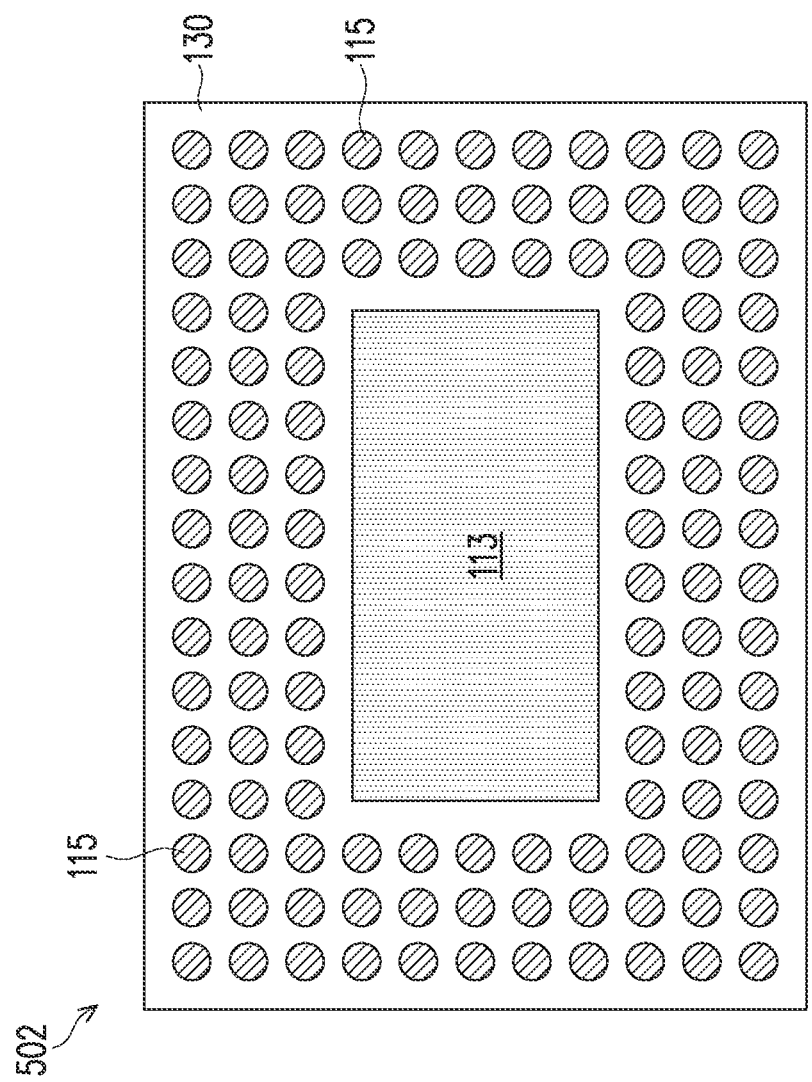
Figure 19:
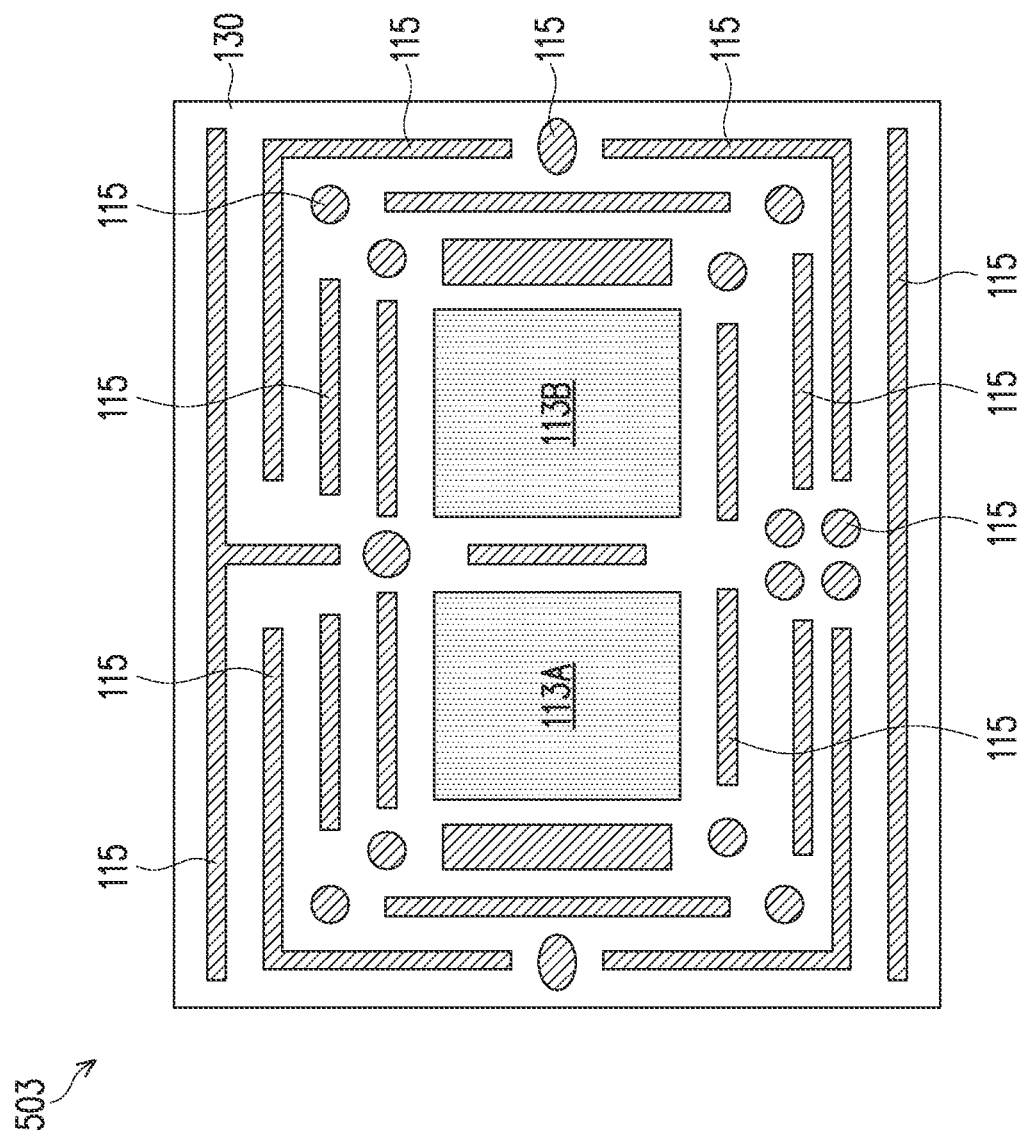

FIGS. 17, 18, and 19 respectively illustrate plan views of device packages 501, 502, and 503 having different configurations of thermal structures 115, in accordance with some embodiments. FIGS. 17-19 are illustrated along a cross-sectional view similar to that of FIG. 9B. The device packages 501-503 are similar to the device package 200 shown in FIG. 9B, except for the configurations, shapes, and arrangements of the thermal structures 115 and, in the case of device package 503, the second semiconductor devices 113A-B. The embodiments shown in FIGS. 17-19 are intended as non-limiting examples for illustrative purposes, and thermal structures 115 of other dimensions, shapes, arrangements, or configurations may be formed in other embodiments. The embodiments shown in FIGS. 17-19 and variations thereof may be applied to any of the other embodiments of described herein.

FIG. 17 illustrates a device package 501 that is similar to the device package 200 shown in FIG. 9B, except that no gaps (e.g., gaps 117) are present between adjacent thermal structures 115 in each row. In other words, each row on a side of the second semiconductor devices 113 comprises a single thermal structure 115. In some cases, forming thermal structures 115 without gaps or with fewer gaps may improve heat dissipation and improve structural support.

FIG. 18 illustrates a device package 502 that is similar to the device package 200 shown in FIG. 9B, except that the thermal structures 115 are pillar-shaped structures arranged in an array. The spacing, dimensions, number, and arrangement of the pillar-shaped thermal structures 115 shown is an example, and other configurations are possible. In some cases, forming thermal structures 115 as pillars may improve heat dissipation and improve structural support.

FIG. 19 illustrates a device package 503 that is similar to the device package 200 shown in FIG. 9B, except that the thermal structures 115 have a variety of shapes and sizes, and multiple second semiconductor devices 113A-B are attached to the first semiconductor device 101. The second semiconductor devices 113A-B may be similar to the second semiconductor devices 113 described earlier, and the second semiconductor device 113A may be similar to or different than the second semiconductor device 113B. More than two second semiconductor devices 113 may be attached in other embodiments. The thermal structures 115 may be configured in any suitable configuration, which may depend on the parameters, operational characteristics, or design of the device package. For example, the thermal structures 115 of the device package 503 include thermal structures 115 that are rectangular, wall-shaped, rounded, pillar-shaped, L-shaped, T-shaped, with gaps, without gaps, of different lengths, and of different widths. The thermal structures 115 may be present between semiconductor devices 113A-B, may be regularly spaced or irregularly spaced, or may have a symmetrical arrangement or an asymmetrical arrangement. This is an example, and other configurations are possible. In this manner, the thermal structures 115 may be suitably configured for a particular application or design.

Embodiments may achieve advantages. By replacing portions of an encapsulant or molding material with a high thermal conductivity material, more efficient heat dissipation paths may be formed in a package. The formation of these thermally conductive "thermal structures" can improve the thermal performance of a package, such as a package comprising stacked semiconductor devices or the like. In some cases, the improved thermal performance can allow for more design flexibility for a device or package. The thermal structures formed from the high thermal conductivity material can be configured to have any suitable shapes, sizes, or arrangements to efficiently dissipate heat. Additionally, the thermal structures may be electrically isolated from other electrical features in a package. In some cases, additional improvement to heat dissipation may be achieved by forming bonding features of high thermal conductivity material that are used to bond a support structure.

In accordance with an embodiment of the present disclosure, a device includes a first semiconductor device including a first bonding layer; a second semiconductor device bonded to the first bonding layer of the first semiconductor device; thermal structures disposed beside the second semiconductor device and on the first bonding layer, wherein the thermal structures include a conductive material, wherein the thermal structures are electrically isolated from the first semiconductor device and from the second semiconductor device; an encapsulant disposed on the first bonding layer, wherein the encapsulant surrounds the second semiconductor device and surrounds the thermal structures; and a second bonding layer disposed over the encapsulant, the thermal structures, and the second semiconductor device. In an embodiment, the thermal structures include copper. In an embodiment, the device includes a support structure including a third bonding layer, wherein the third bonding layer is bonded to the second bonding layer. In an embodiment, the device includes first conductive pads in the second bonding layer and second conductive pads in the third bonding layer, wherein the first conductive pads are bonded to the second conductive pads. In an embodiment, the first conductive pads physically contact the encapsulant. In an embodiment, the thermal structures are wall-shaped. In an embodiment, the thermal structures are pillar-shaped. In an embodiment, top surfaces of the encapsulant and top surfaces of the thermal structures are level.

In accordance with an embodiment of the present disclosure, a package includes a dielectric layer over a semiconductor substrate; a first semiconductor die bonded to the dielectric layer; an encapsulant disposed over the dielectric layer and on sidewalls of the first semiconductor die, wherein the encapsulant has a first thermal conductivity; a first thermal structure penetrating through the encapsulant to physically contact the dielectric layer, wherein the first thermal structure has a second thermal conductivity that is greater than the first thermal conductivity; a first bonding layer disposed over the first semiconductor die, the encapsulant, and the first thermal structure; and a support structure including a second bonding layer over a support substrate, wherein the second bonding layer is bonded to the first bonding layer. In an embodiment, a top surface of the first thermal structure is a first height above the semiconductor substrate and a top surface of the encapsulant is the first height above the semiconductor substrate. In an embodiment, the package includes a second thermal structure penetrating through the encapsulant to physically contact the dielectric layer, wherein the second thermal structure has the second thermal conductivity, wherein the second thermal structure is opposite the first semiconductor die from the first thermal structure. In an embodiment, the semiconductor substrate includes a metallization layer, wherein the first thermal structure is isolated from the metallization layer by the dielectric layer. In an embodiment, the first thermal structure includes a dielectric material. In an embodiment, the first bonding layer includes first metal portions and the second bonding layer includes second metal portions, wherein the first metal portions are bonded to the second metal portions. In an embodiment, the second metal portions physically contact the support substrate.

In accordance with an embodiment of the present disclosure, a method includes bonding a first semiconductor device to a top surface of a second semiconductor device; forming thermally conductive structures beside the first semiconductor device and on the top surface of the second semiconductor device, wherein the thermally conductive structures are electrically isolated from the second semiconductor device; encapsulating the thermally conductive structures, the first semiconductor device, and the second semiconductor device with an encapsulant; depositing a bonding layer on the top surfaces of the thermally conductive structure, the encapsulant, and the first semiconductor device; and bonding a support structure to the bonding layer. In an embodiment, forming the thermally conductive structures protruding from the top surface of the second semiconductor device includes attaching the thermally conductive structures to the top surface of the second semiconductor device with an adhesive. In an embodiment, forming the thermally conductive structures protruding from the top surface of the second semiconductor device includes depositing a conductive material on the top surface of the second semiconductor device. In an embodiment, the method includes performing a planarization process, wherein after the planarization process top surfaces of the thermally conductive structures, the encapsulant, and the first semiconductor device are coplanar. In an embodiment, bonding the support structure to the bonding layer includes performing a dielectric-to-dielectric bonding process and a metal-to-metal bonding process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first semiconductor device comprising a first bonding layer;
   a second semiconductor device bonded to the first bonding layer of the first semiconductor device, wherein the second semiconductor device physically contacts the first bonding layer;
   a plurality of thermal structures disposed beside the second semiconductor device and on the first bonding layer, wherein the thermal structures comprise a conductive material, wherein the thermal structures are electrically isolated from the first semiconductor device and from the second semiconductor device;
   an encapsulant disposed on the first bonding layer, wherein the encapsulant surrounds the second semiconductor device and surrounds the plurality of thermal structures; and
   a second bonding layer disposed over the encapsulant, the plurality of thermal structures, and the second semiconductor device, wherein a sidewall of the first semiconductor device and a sidewall of the second bonding layer are coterminous.

2. The device of claim 1, wherein the plurality of thermal structures comprise copper.

3. The device of claim 1 further comprising a support structure comprising a support bonding layer, wherein the support bonding layer is bonded to the second bonding layer.

4. The device of claim 3 further comprising first conductive pads in the second bonding layer and second conductive pads in the support bonding layer, wherein the first conductive pads are bonded to the second conductive pads.

5. The device of claim 4, wherein the first conductive pads physically contact the encapsulant.

6. The device of claim 1, wherein the thermal structures are wall-shaped.

7. The device of claim 1, wherein the thermal structures are pillar-shaped.

8. The device of claim 1, wherein top surfaces of the encapsulant and top surfaces of the plurality of thermal structures are level.

9. A package, comprising:
   a dielectric layer over a semiconductor substrate;
   a first semiconductor die bonded to the dielectric layer;
   an encapsulant disposed over the dielectric layer and on sidewalls of the first semiconductor die, wherein the encapsulant has a first thermal conductivity;
   a first thermal structure penetrating through the encapsulant to physically contact the dielectric layer, wherein the first thermal structure has a second thermal conductivity that is greater than the first thermal conductivity;
   a first bonding layer disposed over the first semiconductor die, the encapsulant, and the first thermal structure; and
   a support structure comprising a second bonding layer over a support substrate, wherein the second bonding layer is bonded to the first bonding layer.

10. The package of claim 9, wherein a top surface of the first thermal structure is a first height above the semiconductor substrate and a top surface of the encapsulant is the first height above the semiconductor substrate.

11. The package of claim 9 further comprising a second thermal structure penetrating through the encapsulant to physically contact the dielectric layer, wherein the second thermal structure has the second thermal conductivity, wherein the second thermal structure is opposite the first semiconductor die from the first thermal structure.

12. The package of claim 9, wherein the semiconductor substrate comprises a metallization layer, wherein the first thermal structure is isolated from the metallization layer by the dielectric layer.

13. The package of claim 9, wherein the first thermal structure comprises a dielectric material.

14. The package of claim 9, wherein the first bonding layer comprises first metal portions and the second bonding layer comprises second metal portions, wherein the first metal portions are bonded to the second metal portions.

15. The package of claim 14, wherein the second metal portions physically contact the support substrate.

16. A method, comprising:
bonding a first semiconductor device to a top surface of a second semiconductor device;
forming a plurality of thermally conductive structures beside the first semiconductor device and on the top surface of the second semiconductor device, wherein the thermally conductive structures are electrically isolated from the second semiconductor device;
encapsulating the plurality of thermally conductive structures, the first semiconductor device, and the second semiconductor device with an encapsulant;
depositing a bonding layer on the top surfaces of the plurality of thermally conductive structure, the encapsulant, and the first semiconductor device; and
bonding a support structure to the bonding layer.

17. The method of claim 16, wherein forming the plurality of thermally conductive structures protruding from the top surface of the second semiconductor device comprises attaching the plurality of thermally conductive structures to the top surface of the second semiconductor device with an adhesive.

18. The method of claim 16, wherein forming the plurality of thermally conductive structures protruding from the top surface of the second semiconductor device comprises depositing a conductive material on the top surface of the second semiconductor device.

19. The method of claim 16 further comprising performing a planarization process, wherein after the planarization process top surfaces of the plurality of thermally conductive structures, the encapsulant, and the first semiconductor device are coplanar.

20. The method of claim 16, wherein bonding the support structure to the bonding layer comprises performing a dielectric-to-dielectric bonding process and a metal-to-metal bonding process.

* * * * *